US012219747B2

(12) United States Patent
Pao et al.

(10) Patent No.: US 12,219,747 B2
(45) Date of Patent: Feb. 4, 2025

(54) MEMORY ACTIVE REGION LAYOUT FOR IMPROVING MEMORY PERFORMANCE

(71) Applicant: Taiwan Semiconductor Manufacturing Company, Ltd., Hsin-Chu (TW)

(72) Inventors: Chia-Hao Pao, Kaohsiung (TW); Chih-Chuan Yang, Hsinchu (TW); Shih-Hao Lin, Hsinchu (TW); Chih-Hsuan Chen, Hsinchu (TW); Kian-Long Lim, Hsinchu (TW); Chao-Yuan Chang, New Taipei (TW); Feng-Ming Chang, Hsinchu County (TW); Lien Jung Hung, Taipei (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 571 days.

(21) Appl. No.: 17/401,151

(22) Filed: Aug. 12, 2021

(65) Prior Publication Data

US 2023/0046028 A1    Feb. 16, 2023

(51) Int. Cl.
*H10B 10/00*  (2023.01)
*G06F 30/392*  (2020.01)
(Continued)

(52) U.S. Cl.
CPC ......... *H10B 10/125* (2023.02); *G06F 30/392* (2020.01); *H01L 29/0665* (2013.01); *H01L 29/42392* (2013.01); *H01L 29/78696* (2013.01)

(58) Field of Classification Search
CPC .............. H10B 10/125; H01L 29/0665; H01L 29/42392; H01L 29/78696; G06F 30/392
See application file for complete search history.

(56) References Cited

U.S. PATENT DOCUMENTS

| 2013/0242645 | A1* | 9/2013 | Calhoun | H01L 21/28097 |
| | | | | 438/587 |
| 2019/0006374 | A1* | 1/2019 | Liaw | H01L 21/823842 |
| 2021/0233909 | A1* | 7/2021 | Bao | H01L 21/30604 |

FOREIGN PATENT DOCUMENTS

| TW | 202127296 A | 7/2021 |
| TW | 202129722 A | 8/2021 |

OTHER PUBLICATIONS

Jheng-Yi Chen et al. "Three Operation Modes of 6T-SRAM Using 5nm-Node Multi-Vt FR-SOI MOSFETS", Department of Electrical Engineering, National Cheng Kung University, Tainan 701, Taiwan, 4 pages.

* cited by examiner

*Primary Examiner* — Christine A Enad
(74) *Attorney, Agent, or Firm* — HAYNES AND BOONE, LLP

(57) ABSTRACT

SRAM designs based on GAA transistors are disclosed that provide flexibility for increasing channel widths of transistors at scaled IC technology nodes and relax limits on SRAM performance optimization imposed by FinFET-based SRAMs. GAA-based SRAM cells described have active region layouts with active regions shared by pull-down GAA transistors and pass-gate GAA transistors. A width of shared active regions that correspond with the pull-down GAA transistors are enlarged with respect to widths of the shared active regions that correspond with the pass-gate GAA transistors. A ratio of the widths is tuned to obtain ratios of pull-down transistor effective channel width to pass-gate effective channel width greater than 1, increase an on-current of pull-down GAA transistors relative to an on-current of pass-gate GAA transistors, decrease a threshold voltage of pull-down GAA transistors relative to a
(Continued)

threshold voltage of pass-gate GAA transistors, and/or increases a β ratio of an SRAM cell.

20 Claims, 7 Drawing Sheets

(51) Int. Cl.
*H01L 29/06* (2006.01)
*H01L 29/423* (2006.01)
*H01L 29/786* (2006.01)

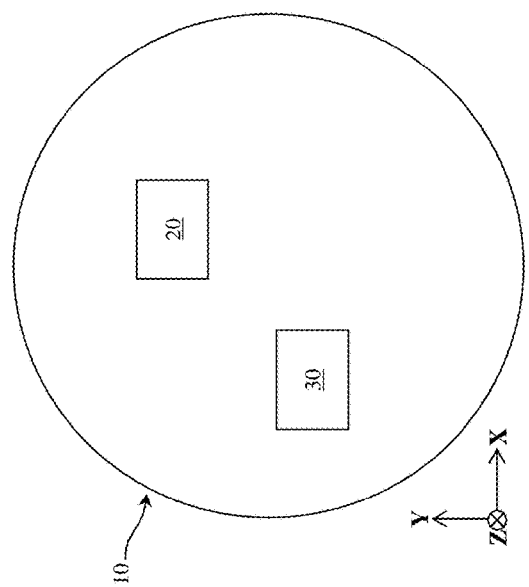
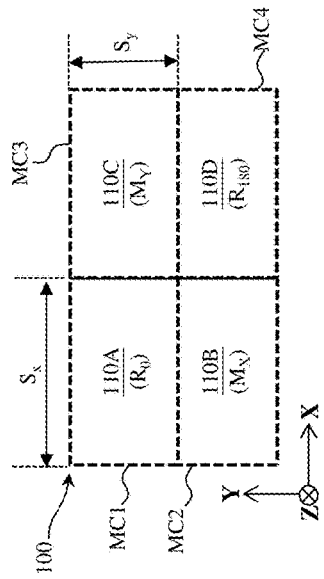
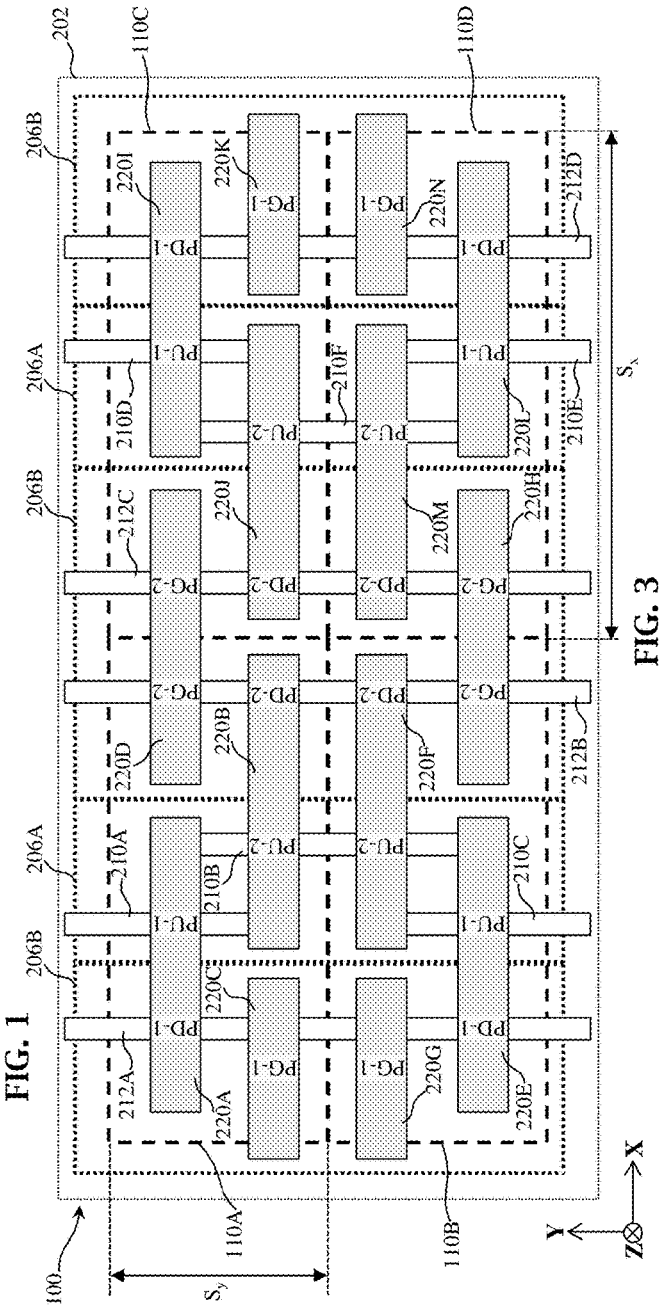
FIG. 1
FIG. 2
FIG. 3

MEMORY ACTIVE REGION LAYOUT FOR IMPROVING MEMORY PERFORMANCE

BACKGROUND

Static random-access memory ("SRAM") generally refers to any memory or storage that retains stored data when power is applied. As integrated circuit (IC) technologies progress towards smaller technology nodes, SRAMs often incorporate fin-based structures, such as fin-like field effect transistors (FinFETs), into SRAM cells to enhance performance, where each SRAM cell can store a bit of data. However, fin-based SRAMs provide limited design flexibility as IC technology nodes continually scale, particularly when trying to optimize SRAM performance (e.g., improved read stability and/or write stability) by modifying physical dimensions of FinFETs. Accordingly, although fin-based SRAM layouts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

FIG. 1 is a fragmentary diagrammatic plan view of an integrated circuit (IC) chip, in portion or entirety, according to various aspects of the present disclosure.

FIG. 2 and FIG. 3 are fragmentary diagrammatic plan views of a memory array, such as a static random-access memory (SRAM) array, in portion or entirety, that can be incorporated into the IC chip of FIG. 1 according to various aspects of the present disclosure.

DETAILED DESCRIPTION

Figure 4:
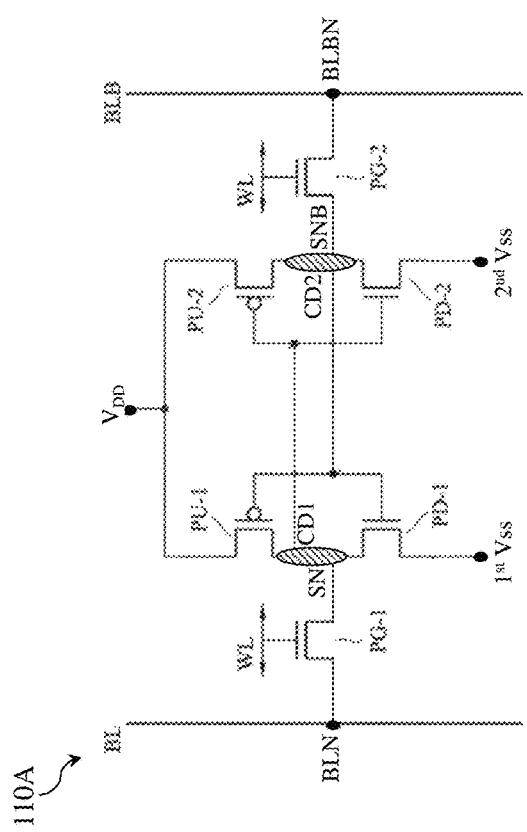
FIG. 4 and FIG. 5 are circuits diagrams of a memory cell of a memory array, such as an SRAM cell of an SRAM array, that can be incorporated into the memory array of FIG. 2 and FIG. 3, according to various aspects of the present disclosure.

The present disclosure is generally related to semiconductor devices, and more particularly, to field-effect transistors (FETs), such as three-dimensional gate-all-around (GAA) FETs, in memory cells and/or standard (logic) cells of integrated circuits (IC).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," "substantially," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. In another example, two features described as having "substantially the same" dimension and/or "substantially" oriented in a particular direction and/or configuration (e.g., "substantially parallel") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

Static random-access memories (SRAMs) are widely used in portable device applications and/or mobile device applications and are often designed to balance speed of operation (e.g., access time) with power consumption. For example, a high-speed SRAM (i.e., fast access times) may consume more than desired power, while a low-power SRAM may operate slower than desired (e.g., slower access times). Despite rising demand for high-speed, low-power SRAMs with advancing IC technologies, high-speed, low-power SRAMs have been elusive as device densities shrink with scaling IC technology nodes, particularly as IC technology nodes shrink to 20 nm and below. Such scaling has exacerbated tradeoffs between SRAM speed and SRAM power and introduced challenges to SRAM stability (e.g., read stability and write stability of SRAM cells). As an example, read stability of an SRAM cell depends on a beta (β) ratio of the SRAM cell, which refers to a ratio of an on (drive) current of a pull-down transistor ($I_{on-PD}$) to an on (drive) current of a pass-gate transistor ($I_{on-PG}$) (i.e., $\beta=I_{on-PD}/I_{on-PG}$). It has been observed that increasing the β ratio improves read stability of the SRAM cell, and since the β ratio is proportional to the on-current of the pull-down transistor, the SRAM cell can be designed to increase the on-current of the pull-down transistor, and thus desirably increase the β ratio. Assuming the pull-down transistor and the pass-gate transistor have a same channel length, on-current of a transistor is proportional to a channel width of the transistor (i.e., a wider channel (and thus wider channel width) will drive more current therethrough for a given voltage applied to the transistor), and a channel width of the pull-down transistor can be increased relative to a channel width of the pass-gate transistor to increase the on-current of the pull-down transistor relative to the on-state current of the pass-gate transistor, and thus increase and/or modify the β ratio as needed.

The present disclosure recognizes that SRAMs based on fin-like field effect transistors (FinFETs) provide limited flexibility for increasing/decreasing channel widths at scaled IC technology nodes and thus make optimizing SRAM performance, such as a β ratio of an SRAM cell, difficult. For example, a FinFET generally refers to a transistor having a channel formed from a semiconductor fin extending from a substrate, where the channel is disposed between a source and a drain and a gate of the transistor wraps the semiconductor fin, such that the gate is disposed on three sides of the channel, instead of one side of the channel as in a planar transistor. A FinFET's effective channel width depends on a height of the semiconductor fin and a width of the semiconductor fin, where increases in the effective channel width are typically achieved by increasing the height of the semiconductor fin. Increases to height of the semiconductor fin are constrained at scaled IC technology nodes, particularly as the width of the semiconductor fin decreases to achieve higher SRAM cell densities. One solution for increasing FinFET effective channel width has been to increase a number of semiconductor fins per transistor, such as where an SRAM cell may be configured with pass-gate FinFETs having two fins, pull-down FinFETs having two fins, and pull-up FinFETs having one fin. While this solution can increase on-current of pass-gate FinFETs and/or on-current of pull-down FinFETs, such solution still presents challenges when SRAM performance optimization is achieved by varying channel widths of the pull-down FinFETs relative to channel widths of the pass-gate FinFETs, such as that associated with optimizing the β ratio. For example, where a pass-gate FinFET and a pull-down FinFET may share two semiconductor fins to increase SRAM cell density and/or simplify SRAM cell fabrication, lithography and etching processes may be performed to remove one of the two semiconductor fins from a region of the two semiconductor fins that corresponds with the pass-gate FinFET and provide the pass-gate FinFET with a smaller effective channel width than the pull-down FinFET. However, such lithography and etching processes are severely constrained by process windows at scaled IC technology nodes and ensuring that semiconductor fins directly adjacent to the removed semiconductor fin, such as the other one of the two semiconductor fins intended to remain for the pass-gate FinFET and/or a semiconductor fin that belongs to an adjacent pull-up FinFET, are not inadvertently removed and/or damaged by the lithography and etching processes is difficult. Accordingly, FinFET-based SRAM cells typically have a ratio of a pull-down effective channel width to a pass-gate effective channel width that is 1:1, which provides the pull-down FinFET and the pass-gate FinFET with the same on-current and a β ratio of 1.

To overcome such challenges, the present disclosure proposes SRAM designs that are based on gate-all-around (GAA) transistors, where the proposed GAA-based SRAMs provide flexibility for increasing/decreasing channel widths at scaled IC technology nodes and relax limits on SRAM performance optimization, such as optimization of a β ratio of an SRAM cell and/or optimization of threshold voltages of transistors of the SRAM cell, imposed by FinFET-based SRAMs. GAA transistor generally refers to a transistor having a channel formed from a semiconductor layer suspended over a substrate, where the channel is disposed between a source and a drain and a gate of the transistor surrounds the semiconductor layer. Often, the channel is formed from a stack of semiconductor layers suspended over the substrate, where the gate surrounds each of the semiconductor layers and is disposed between directly adjacent semiconductor layers. A GAA's effective channel width depends on a thickness of the semiconductor layers, widths of the semiconductor layers, and number of semiconductor layers that form the channel. GAA-based SRAM cells described herein have active region layouts that provide a ratio of pull-down transistor effective channel width to pass-gate effective channel width that is greater than 1, which increases an on-current of pull-down GAA transistors relative to an on-current of pass-gate GAA transistors, decreases a threshold voltage of pull-down GAA transistors relative to a threshold voltage of pass-gate GAA transistors, and/or increases a β ratio of an SRAM cell to greater than 1, thereby improving SRAM performance.

In some embodiments, the disclosed active region layouts provide pull-down/pass-gate effective channel width ratios that are greater than 1 by identifying an active region shared by a pull-down GAA transistor and a pass-gate GAA transistor, where the active region has a first width in a pull-down transistor region that corresponds with the pull-down GAA transistor and in a pass-gate transistor region that corresponds with the pass-gate GAA transistor, and enlarging the pull-down transistor region relative to the pass-gate transistor region, such that the active region has a second width in the pull-down transistor region. The pull-down transistor region is enlarged by adding active region extensions (also referred to as active region jogs) to sidewalls of the active region in the pull-down transistor region. In some embodiments, the pull-down transistor region extends beyond both sidewalls of the pass-gate transistor region. Enlarging the active region in the pull-down transistor region results in a corresponding increase in effective channel width of the pull-down GAA transistor relative to effective channel width of the pass-gate transistor, increase in on-current of the pull-down GAA transistor relative to on-current of the pass-gate transistor (and thus an increase in the β ratio), and decrease in threshold voltage of the pull-down GAA transistor relative to threshold voltage of the pass-gate transistor. Accordingly, enlarging the active region in the pull-down transistor region can be used to tune a ratio of the second width to the first width, a ratio of the effective channel width of the pull-down GAA transistor to effective channel width of the pass-gate transistor, and/or the β ratio. Further, modifying the active region layout for GAA-based SRAMs as described herein provides greater SRAM optimization flexibility with regard to modifying physical dimensions compared to FinFET-based SRAMs. In some embodiments, by fabricating a GAA-based SRAM using the modified active region layout, varying effective channel widths for the pull-down transistor region and the pass-gate active region are achieved by directly patterning a semiconductor layer stack according to the modified active region layout, instead of patterning a semiconductor channel layer to form fins according to an active region layout and then performing a lithography and etching process to remove some of the fins as needed for FinFET-based SRAMS. In some embodiments, in contrast to active regions formed from single-layer fin structures that are generally formed by one or more spacer patterning process (e.g., multiple patterning processes), active regions formed from semiconductor layer stacks can be formed by directly patterning a semiconductor layer stack, which allows adjustment of a width of an active region at desired locations along a length of the active region, thereby achieving widening of the pull-down transistor regions of the active regions relative to the pass-gate transistor regions of the active regions. Different embodiments may have different advantages, and no particular advantage is required of any embodiment.

FIG. 1 is a fragmentary diagrammatic plan view of an integrated circuit (IC) chip 10, in portion or entirety, according to various aspects of the present disclosure. IC chip 10 can include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In the depicted embodiment, IC chip 10 includes a memory region 20 and a logic region 30. Memory region 20 can include an array of memory cells, each of which includes transistors and interconnect structures (also referred to as routing structures) that combine to provide a storage device and/or a storage function, such as a flip flop, a latch, other suitable memory devices, or combinations thereof. In some embodiments, memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnect structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of IC chip 10.

FIG. 2 and FIG. 3 are fragmentary diagrammatic plan views of a memory array, such as an SRAM array 100, in portion or entirety, that can be incorporated into IC chip 10 of FIG. 1 according to various aspects of the present disclosure. In some embodiments, memory region 20 of IC chip 10 includes SRAM array 100. In FIG. 2 and FIG. 3, SRAM array 100 includes an SRAM cell 110A having a cell boundary MC1, an SRAM cell 110B having a cell boundary MC2, an SRAM cell 110C having a cell boundary MC3, and an SRAM cell 110D having a cell boundary MC4. In the depicted embodiment, cell boundaries MC1-MC4 have substantially the same sizes, such as a first dimension, a cell width $S_X$, along a first direction (e.g., x-pitch along an x-direction) and a second dimension, a cell height $S_Y$, along a second direction (e.g., y-pitch along a y-direction). In some embodiments, cell width $S_X$ is greater than cell height $S_Y$. For example, a ratio of cell width $S_X$ to a ratio of cell height $S_Y$ is greater than one. SRAM cells 110A-110D are arranged in a two-by-two array (or grid), where a layout of an SRAM cell is repeated in SRAM memory array 100, such that SRAM cells 110A-110D exhibit mirror symmetry and/or rotational symmetry with respect to each other. For example, using SRAM cell 110A as a reference (denoted "$R_0$"), a layout of SRAM cell 110B is a mirror image (denoted "$M_X$") of a layout of the SRAM cell 110A with respect to an x-axis, a layout of SRAM cell 110C is a mirror image (denoted "My") of the layout of SRAM cell 110A with respect to a y-axis, and a layout of SRAM cell 110D is a mirror image of the layout of SRAM cell 110B along the y-axis. Put another way, the layout of SRAM cell 110D (denoted "$R_{180}$") is symmetric to the layout of SRAM cell 110A by a rotation of 180 degrees about a geometric center of the grid, which can generally refer to an intersection point of an imaginary reference line bisecting the grid (array) along the y-axis and an imaginary reference line bisecting the grid along the x-axis. In some embodiments, cell width $S_X$ can represent and be referred to as a memory cell pitch of SRAM array 100 along the x-direction and cell height $S_Y$ can represent and be referred to as a memory cell pitch of SRAM array 100 along the y-direction. In the depicted embodiment, each of SRAM cells 110A-110D includes GAA FETs, which are further discussed below. In some embodiments, SRAM cell 110A, SRAM cell 110B, SRAM cell 110C, and/or SRAM cell 110D are configured for similar applications, such as high-speed applications, low-power applications, super high-speed applications, other suitable applications, or combinations thereof, and/or with the same specifications, such as physical characteristics (e.g., dimensions, layouts, etc.) and/or electrical characteristics (e.g., threshold voltages, on current (Ion), read voltages, write voltages, etc.). In some embodiments, SRAM cell 110A, SRAM cell 110B, SRAM cell 110C, and/or SRAM cell 110D are configured for different applications and/or with different specifications. FIG. 2 and FIG. 3 have been simplified for the sake of clarity to better understand the inventive concepts of the present disclosure. Additional features can be added in SRAM array 100, and some of the features described herein can be replaced, modified, or eliminated in other embodiments of SRAM array 100.

Referring to FIG. 3, SRAM array 100 includes a substrate (wafer) 202 having n-type doped regions, such as n-wells 206A, and p-type doped regions, such as p-wells 206B, disposed therein. In the depicted embodiment, each of SRAM cells 110A-110D includes a portion of substrate 202 having a respective n-well 206A disposed between a respective pair of p-wells 206B. Substrate 202 includes an elementary semiconductor, such as silicon and/or germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. In some embodiments, substrate 202 is a semiconductor-on-insulator substrate, such as a silicon-on-insulator (SOI) substrate, a silicon germanium-on-insulator (SGOI) substrate, or a germanium-on-insulator (GOI) substrate. N-wells 206A are doped with n-type dopants, such as phosphorus, arsenic, other n-type dopant, or combinations thereof. P-wells 206B are doped with p-type dopants, such as boron, indium, other p-type dopant, or combinations thereof. In some embodiments, substrate 202 includes doped regions formed with a combination of p-type dopants and n-type dopants. The various n-type doped regions and/or p-type doped regions can be formed directly on and/or in substrate 202, for example, providing a p-well structure, an n-well structure, a dual-well structure, a raised structure, or combinations thereof.

SRAM array 100 further includes active regions, each of which includes channel regions, source regions, and drain regions (where source regions and drain regions are collectively referred to as source/drain regions herein) of transistors of SRAM array 100. For example, SRAM array 100 include an n-type active region 210A, an n-type active region 210B, an n-type active region 210C, an n-type active region 210D, an n-type active region 210E, and an n-type active region 210F disposed over n-wells 206A. SRAM array 100 further includes a p-type active region 212A, a p-type active region 212B, a p-type active region 212C, and a p-type active region 212D disposed over p-wells 206B. N-type active regions 210A-210F and p-type active regions 212A-212D are oriented substantially parallel to each another, extend lengthwise along the y-direction (i.e., length is along the y-direction, width is along the x-direction, and height is along the z-direction), and are spaced from each other along the x-direction. As discussed further below, n-type active regions 210A-210F and p-type active regions 212A-212D are GAA-based active regions, where channel regions thereof are formed by vertically stacked n-type semiconductor layers or vertically stacked p-type semiconductor layers, respectively, suspended over substrate 202 (i.e., the semiconductor layers do not physically contact substrate 202), and source/drain regions thereof are formed by p-type epitaxial source/drain features or n-type epitaxial source/drain features, respectively. In such embodiments, the vertically stacked n-type semiconductor layers are disposed between respective p-type epitaxial source/drain features to provide channel regions and source/drain regions of p-type GAA FETs, and the vertically stacked p-type semiconductor layers are disposed between respective n-type epitaxial source/drain features to provide channel regions and source/drain regions of n-type GAA FETs. Further, each vertical stack of semiconductor layers is disposed over a respective extension portion of substrate 202, which can be referred to as a substrate extension, a mesa (or mesa structure), a fin, etc.

SRAM array 100 further includes gate lines, such as a gate line 220A, a gate line 220B, a gate line 220C, a gate line 220D, a gate line 220E, a gate line 220F, a gate line 220G, a gate line 220H, a gate line 220I, a gate line 220J, a gate line 220K, a gate line 220L, a gate line 220M, and a gate line 220N. Gate lines 220A-220N are oriented substantially parallel to one another, extend lengthwise along the x-direction (i.e., length is along the x-direction, width is along the y-direction, and height is along the z-direction), and are spaced from each other along the y-direction. Gate lines 220A-220N are oriented substantially orthogonal to n-type active regions 210A-210F and/or p-type active regions 212A-212D. Gate lines 220A-220N are disposed over channel regions of respective n-type active regions 210A-210F and/or p-type active regions 212A-212D (i.e., vertically stacked n-type semiconductor layers and/or vertically stacked p-type semiconductor layers, respectively) and disposed between respective source/drain regions of n-type active regions 210A-210F and/or p-type active regions 212A-212D (i.e., p-type epitaxial source/drain features and/or n-type epitaxial source/drain features, respectively). In some embodiments, gate lines 220A-220N wrap and/or surround suspended, vertically stacked n-type semiconductor layers and/or suspended, vertically stacked p-type semiconductor layers of n-type active regions 210A-210F and p-type active regions 212A-212D, respectively. As discussed further below, each of gate lines 220A-220N can include a metal gate stack formed from a gate electrode disposed over a gate dielectric and gate spacers disposed along sidewalls of the metal gate stack.

N-type active regions 210A-210F, p-type active regions 212A-212D, and gate lines 220A-220N are configured to provide each of SRAM cells 110A-110D with six transistors: a pull-down transistor PD-1, a pull-up transistor PU-1, a pull-down transistor PD-2, a pull-up transistor PU-2, a pass-gate transistor PG-1, and a pass-gate transistor PG-2. SRAM cells 110A-110D can alternatively referred to as 6T SRAMs. In SRAM cell 110A, pull-up transistor PU-1 is formed from n-type active region 210A and gate line 220A, pull-up transistor PU-2 is formed from n-type active region 210B and gate line 220B, pull-down transistor PD-1 is formed from p-type active region 212A and gate line 220A, pull-down transistor PD-2 is formed from p-type active region 212B and gate line 220B, pass-gate transistor PG-1 is formed from p-type active region 212A and gate line 220C, and pass-gate transistor PG-2 is formed from p-type active region 212B and gate line 220D. In SRAM cell 110B, pull-up transistor PU-1 is formed from n-type active region 210C and gate line 220E, pull-up transistor PU-2 is formed from n-type active region 210B and gate line 220F, pull-down transistor PD-1 is formed from p-type active region 212A and gate line 220E, pull-down transistor PD-2 is formed from p-type active region 212B and gate line 220F, pass-gate transistor PG-1 is formed from p-type active region 212A and gate line 220G, and pass-gate transistor PG-2 is formed from p-type active region 212B and gate line 220H. In SRAM cell 110C, pull-up transistor PU-1 is formed from n-type active region 210D and gate line 220I, pull-up transistor PU-2 is formed from n-type active region 210F and gate line 220J, pull-down transistor PD-1 is formed from p-type active region 212D and gate line 220I, pull-down transistor PD-2 is formed from p-type active region 212C and gate line 220J, pass-gate transistor PG-1 is formed from p-type active region 212D and gate line 220K, and pass-gate transistor PG-2 is formed from p-type active region 212C and gate line 220D. In SRAM cell 110D, pull-up transistor PU-1 is formed from n-type active region 210E and gate line 220L, pull-up transistor PU-2 is formed from n-type active region 210F and gate line 220M, pull-down transistor PD-1 is formed from p-type active region 212D and gate line 220L, pull-down transistor PD-2 is formed from p-type active region 212C and gate line 220M, pass-gate transistor PG-1 is formed from p-type active region 212D and gate line 220N, and pass-gate transistor PG-2 is formed from p-type active region 212C and gate line 220H. Each of SRAM cells 110A-110D thus includes a respective pull-down transistor PD-1 and a respective pull-up transistor PU-1 that share a gate (e.g., in SRAM cell 110A, a gate of pull-down transistor PD-1 and a gate of pull-up transistor PU-1 are formed from respective portions of gate line 220A), a respective pull-down transistor PD-2 and a respective pull-up transistor PU-2 that share a gate (e.g., in SRAM cell 110A, a gate of pull-down transistor PD-2 and a gate of pull-up transistor PU-2 are formed from respective portions of gate line 220B), a respective pass-gate transistor PG-1 and a respective pull-down transistor PD-1 that share a source/drain (e.g., in SRAM cell 110A, a source of pass-gate transistor PG-1 and a drain of pull-down transistor PD-1 are formed from a n-type epitaxial source/drain feature of p-type active region 212A between gate line 220A and gate line 220C), and a respective pass-gate transistor PG-2 and a respective pull-down transistor PD-2 that share a source/drain (e.g., in SRAM cell 110A, a source of pass-gate transistor PG-2 and a drain of pull-down transistor PD-2 are formed from a n-type epitaxial source/drain feature of p-type active region 212B between gate line 220B and gate line 220D). In some embodiments, pull-up transistor PU-1 and pull-up transistor PU-2 are p-type GAA transistors, and pull-down transistor PD-1, pull-down transistor PD-2, pass-gate transistor PG-1, and pass-gate transistor PG-2 are n-type GAA transistors.

Figure 5:
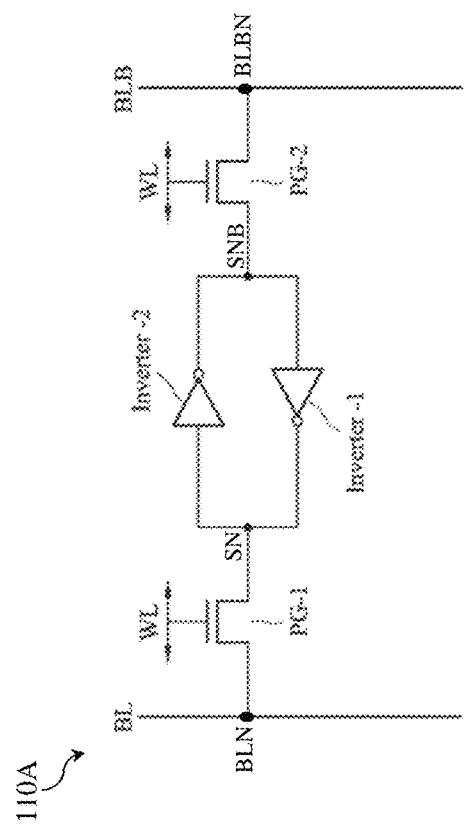

FIG. 4 and FIG. 5 are circuit diagrams of an SRAM circuit that can be implemented in an SRAM cell of a memory array, such as SRAM cell 110A of SRAM array 100, according to various aspects of the present disclosure. The circuit diagram of SRAM cell 110A is merely exemplary, and in some embodiments, each of SRAM cells 110A-110D is configured with an SRAM circuit similar to SRAM cell 110A and as depicted in FIG. 4 and FIG. 5. For example, each of SRAM cells 110A-110D has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inveter-2, and pass-gate transistor PG-2 is connected to an output of Inverter-2 and an input of Inverter-1. In operation, pass-gate transistor PG-1 and pass-gate transistor PG-2 provide access to the storage portion of their respective SRAM cell (i.e., Inverter-1 and Invereter-2) and can also be referred to as access transistors of their respective SRAM cell. Each of SRAM cells 110A-110D is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first supply voltage via a voltage node VDD, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node Vss, and the first common drain. A gate of pull-up transistor PU-2 interposes a source, which is electrically coupled to the first supply voltage via voltage node VDD, and a second common drain (CD2) (i.e., a drain of pull-up transistor PU-2 and a drain of pull-down transistor PD-2). A gate of pull-down transistor PD-2 interposes a source, which is electrically coupled to the second power supply voltage via voltage node Vss, and the second common drain. The first common drain provides a storage node SN that stores data in true form, and the second common drain provides a storage node SNB that stores data in complementary form, or vice versa, in some embodiments. The gate of pull-up transistor PU-1 and the gate of pull-down transistor PD-1 are coupled together and to the second common drain, and the gate of pull-up transistor PU-2 and the gate of pull-down transistor PD-2 are coupled together and to the first common drain. A gate of pass-gate transistor PG-1 interposes a drain connected to a bit line node BLN, which is electrically coupled to a bit line BL, and a source, which is electrically coupled to the second common drain. A gate of pass-gate transistor PG-2 interposes a drain connected to a complementary bit line node BLBN, which is electrically coupled to a complementary bit line BLB, and a source, which is electrically coupled to the first common drain. Gates of pass-gate transistors PG-1, PG-2 are connected to and controlled by a word line WL, which allows selection of a respective SRAM cell, such as SRAM cell 110A, for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to gates of pass-gate transistors PG-1, PG-2 by word line WL. In the depicted embodiment, SRAM cells 110A-110D of SRAM memory 100 are single-port SRAMs. In some embodiments, SRAM cells 110A-110D are configured as multi-port SRAMs, such as dual-port SRAMs, and/or with more or less transistors than depicted, such as 8T SRAMs. FIG. 4 and FIG. 5 have been simplified for the sake of clarity to better understand the inventive concepts of the present disclosure. Additional features can be added in the SRAM circuits of FIG. 4 and FIG. 5, and some of the features described herein can be replaced, modified, or eliminated in other embodiments of the SRAM circuits of FIG. 4 and FIG. 5. embodiments of the SRAM circuits of FIG. 4 and FIG. 5.

With the configuration of SRAM array 100 as described with reference to FIGS. 1-5, pull-down transistors and pass-gate transistors may share active regions, and pull-up transistors may share active regions. For example, pass-gate transistor PG-1 and pull-down transistor PD-1 of SRAM cell 110A share p-type active region 212A, pass-gate transistor PG-1 and pull-down transistor PD-1 of SRAM cell 110B share p-type active region 212A, and pass-gate transistor PG-1/pull-down transistor PD-1 pair of SRAM cell 110A further shares p-type active region 212A with pass-gate transistor PG-1/pull-down transistor PD-1 pair of SRAM cell 110B. In furtherance of the example, pass-gate transistor PG-2 and pull-down transistor PD-2 of SRAM cell 110A share p-type active region 212B, pass-gate transistor PG-2 and pull-down transistor PD-2 of SRAM cell 110B share p-type active region 212B, and pass-gate transistor PG-2/pull-down transistor PD-2 pair of SRAM cell 110A further shares p-type active region 212B with pass-gate transistor PG-2/pull-down transistor PD-2 pair of SRAM cell 110B. In furtherance of the example, pass-gate transistor PG-2 and pull-down transistor PD-2 of SRAM cell 110C share p-type active region 212C, pass-gate transistor PG-2 and pull-down transistor PD-2 of SRAM cell 110D share p-type active region 212C, and pass-gate transistor PG-2/pull-down transistor PD-2 pair of SRAM cell 110C further shares p-type active region 212C with pass-gate transistor PG-2/pull-down transistor PD-2 pair of SRAM cell 110D. In furtherance of the example, pass-gate transistor PG-1 and pull-down transistor PD-1 of SRAM cell 110C share p-type active region 212D, pass-gate transistor PG-1 and pull-down transistor PD-1 of SRAM cell 110D share p-type active region 212D, and pass-gate transistor PG-1/pull-down transistor PD-1 pair of SRAM cell 110C further shares p-type active region 212D with pass-gate transistor PG-1/pull-down transistor PD-1 pair of SRAM cell 110D. Further, pull-up transistor PU-2 of SRAM cell 110A shares n-type active region 210B with pull-up transistor PU-2 of SRAM cell 110B, and pull-up transistor PU-2 of SRAM cell 110C shares n-type active region 210F with pull-up transistor PU-2 of SRAM cell 110D.

Accordingly, each pair of SRAM cells in a column of SRAM array 100 (e.g., SRAM cell 110A and SRAM cell 110B in a first column of SRAM array 100 and SRAM cell 110C and SRAM cell 110D in a second column of SRAM array 100) has a first shared p-type active region having a pass-gate (PG) transistor portion disposed between pull-down (PD) transistor portions (e.g., p-type fin active region 212A and p-type fin active region 212D, respectively), a second shared p-type active region having a PD transistor portion disposed between PG transistor portions (e.g., p-type fin active region 212B and p-type fin active region 212C, respectively), and a shared n-type active region (e.g., n-type fin active region 210B and n-type fin active region 210F, respectively). In the depicted embodiment, each of SRAM cells 110A-110B has two n-type active regions (e.g., n-type active region 210A and n-type active region 210B of SRAM cell 110A) disposed between a first shared p-type active region (e.g., p-type active region 212A of SRAM cell 110A) and a second shared p-type active region (e.g., p-type active region 212B of SRAM cell 110A). In some embodiments, pull-up transistor PU-1 of SRAM cell 110A, pull-up transistor PU-1 of SRAM cell 110B, pull-up transistor PU-1 of SRAM cell 110C, and/or pull-up transistor PU-1 of SRAM cell 110D share, respectively, n-type active region 210A, n-type active region 210C, n-type active region 210D, and/or n-type active region 210E with a pull-up transistor PU-1 of an SRAM cell directly above or below a respective one of SRAM cells 110A-110D. In such embodiments, each pair of SRAM cells in a column of SRAM array 100 includes three shared PU transistor regions (e.g., n-type fin active regions 210A-210C in the first column).

As noted above, readability of an SRAM cell, such as any of SRAM cells 110A-110D, depends on a β ratio of the SRAM cell, which is a ratio of an on-current of a pull-down transistor ($I_{on-PD}$) to an on-current of a pass-gate transistor ($I_{on-PG}$) (i.e., $\beta=I_{on-PD}/I_{on-PG}$). To enhance the β ratio, the present disclosure proposes a GAA-based SRAM layout where pull-down GAA transistors and pass-gate GAA transistors of an SRAM cell have a same channel length, so that a ratio of an effective channel width of the pull-down GAA transistors to a ratio of an effective channel width of the pass-gate GAA transistors correspond with the β ratio. Accordingly, the β ratio of the SRAM cell can be optimized by increasing a width of active regions that correspond with the pull-down GAA transistors relative to a width of active regions that correspond with the pass-gate GAA transistors, which results in corresponding increases in a channel width (and on-current) of the pull-down GAA transistors relative to a channel width (and on-current) of the pass-gate transistors, thereby tuning (for example, increasing) the β ratio of the SRAM cell simply by adjusting widths of active regions (and corresponding effective channel widths) of the pull-down transistors. The active region width adjustments disclosed herein also allow for threshold voltage tuning of the pull-down transistors and/or the pass-gate transistors to further optimize SRAM performance, for example, by improving SRAM read margins. The GAA-based SRAM layout further provides SRAM cells with tunable effective channel width ratios, such as a ratio of a pull-down effective channel width to a pass-gate effective channel width that is greater than 1, instead of being limited to a 1:1 effective channel width ratio as in FinFET-based SRAM layouts.

Figure 6A:
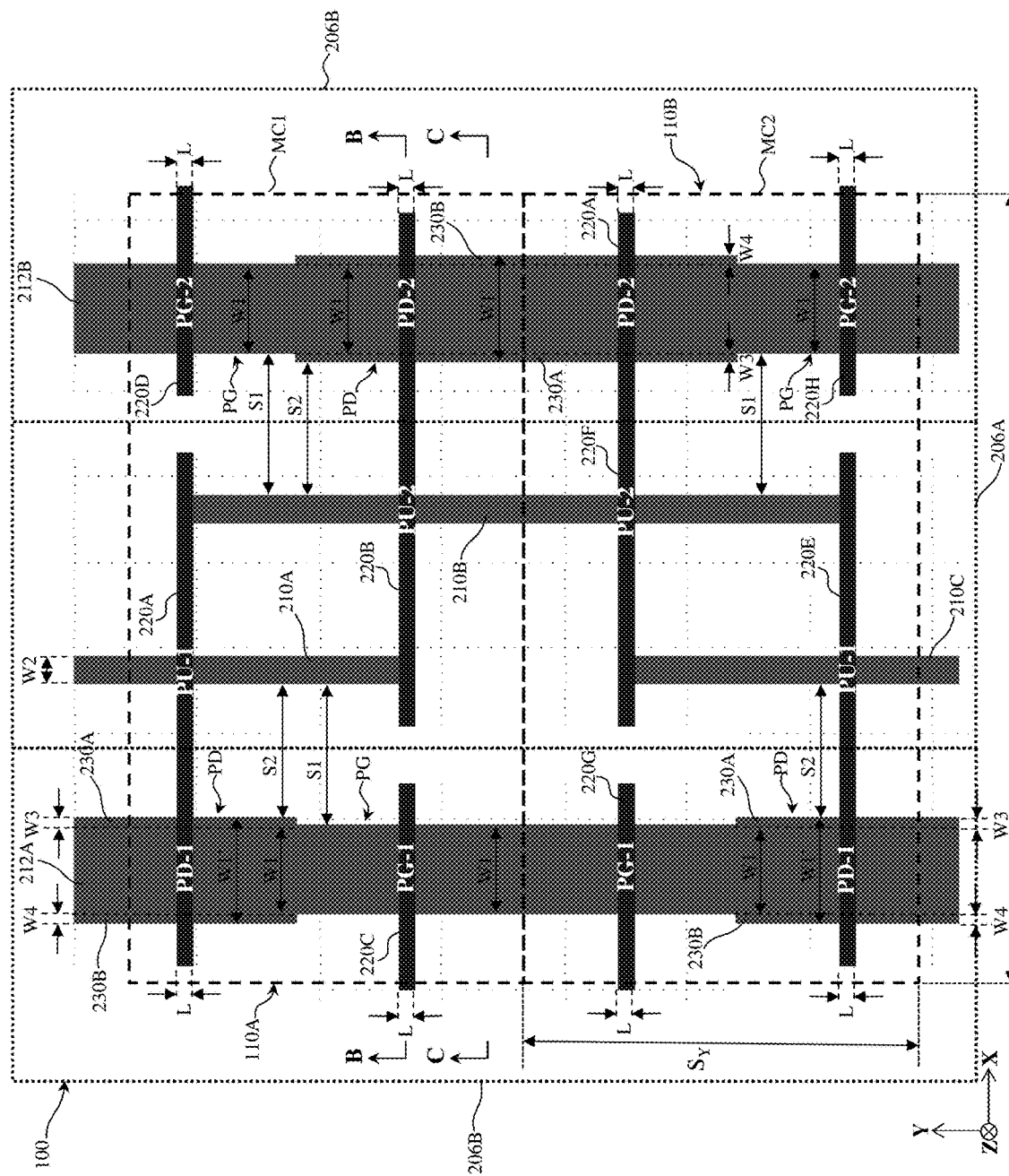
FIG. 6A is a fragmentary diagrammatic top view of a portion of a layout of an active region of a memory array, such as a portion of the memory array of FIGS. 2-5, in portion or entirety, according to various aspects of the present disclosure.
Figure 6B:
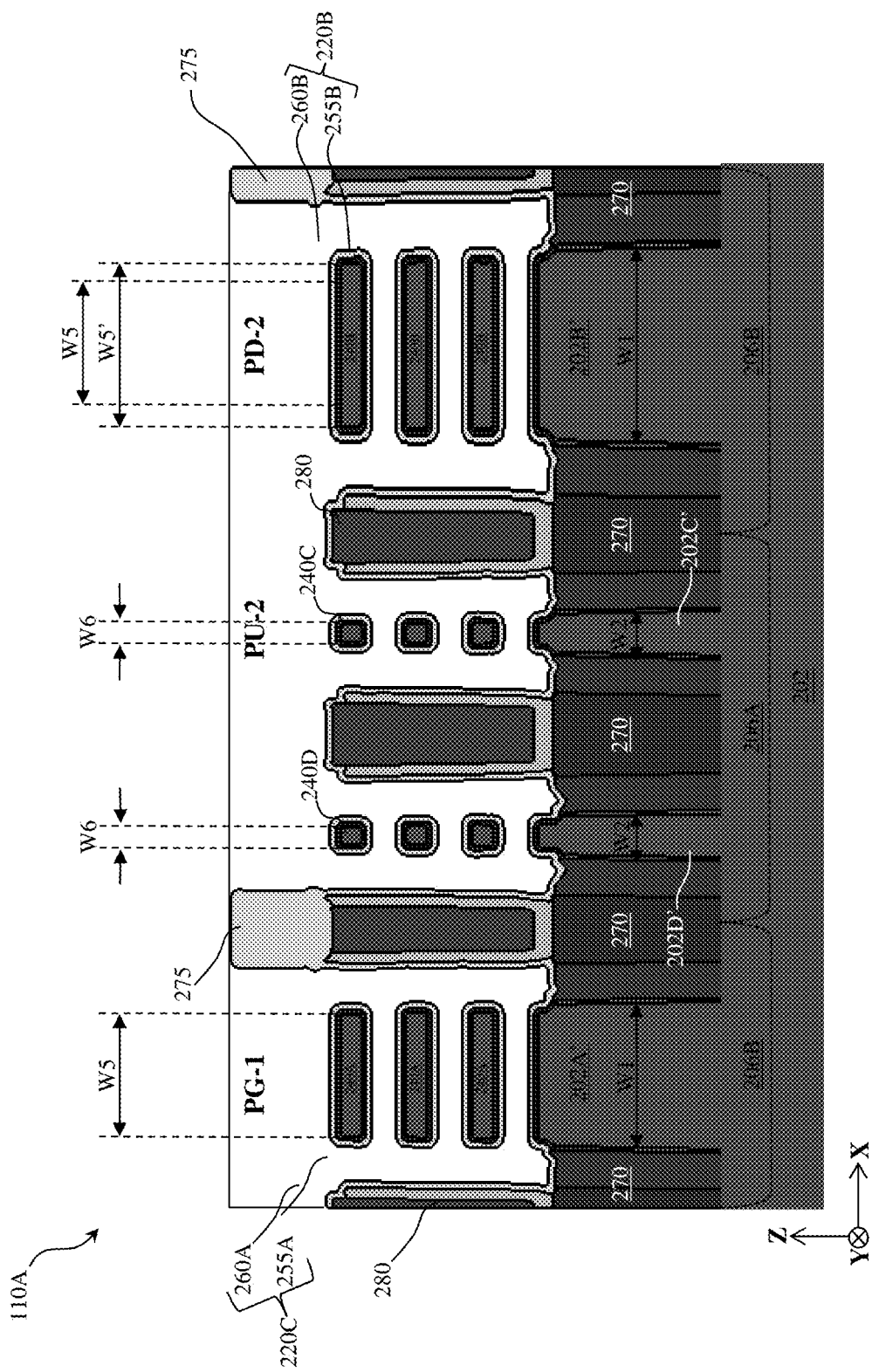
FIG. 6B is a diagrammatic cross-sectional view of the portion of the layout of the active region of the memory array of FIG. 6A, in portion or entirety, along line B-B of FIG. 6A according to various aspects of the present disclosure.
Figure 6C:
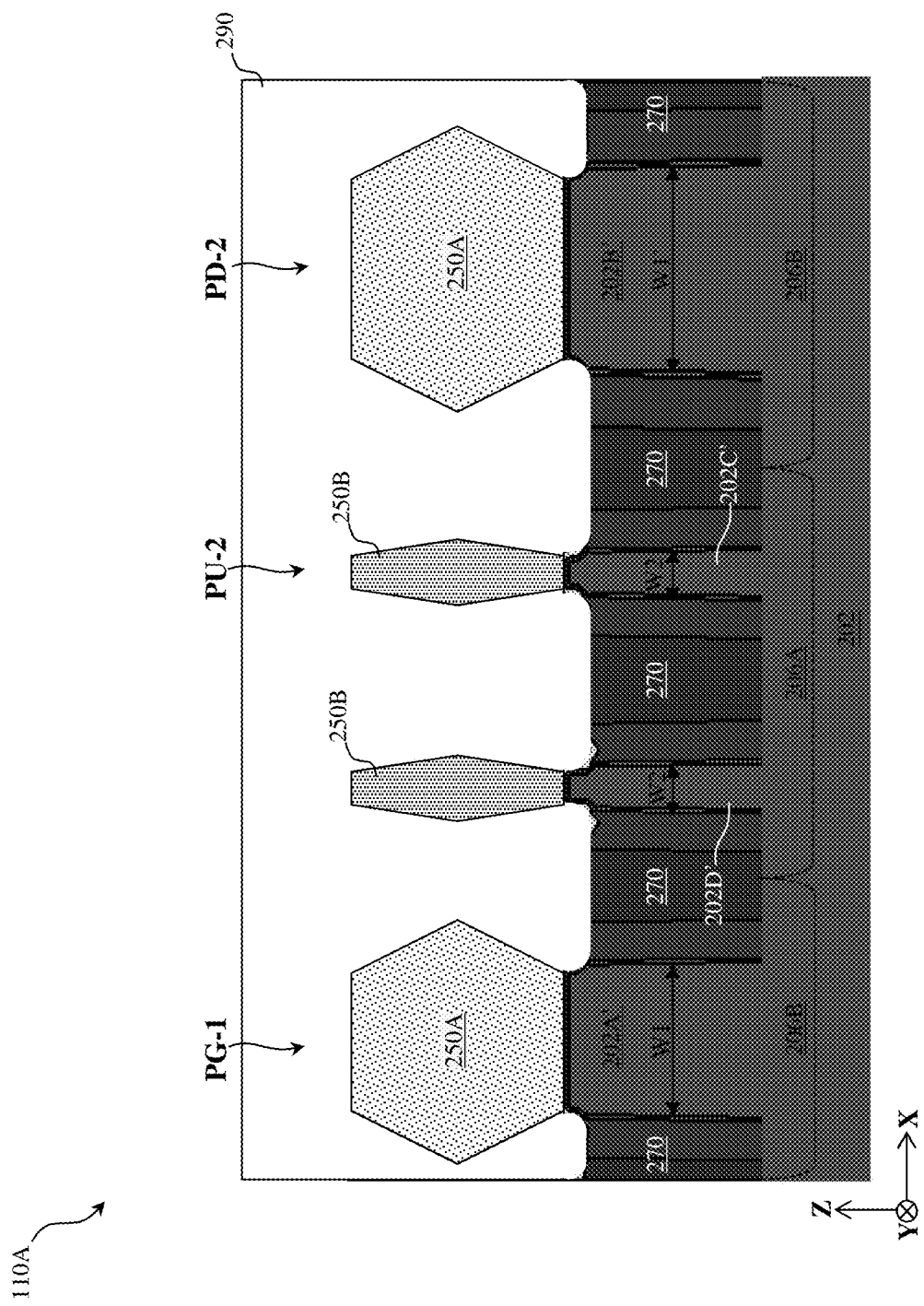
FIG. 6C is a diagrammatic cross-sectional view of the portion of the layout of the active region of the memory array of FIG. 6A, in portion or entirety, along line C-C of FIG. 6A according to various aspects of the present disclosure.

FIG. 6A is a fragmentary diagrammatic top view of a portion of a layout of an active region of an SRAM array, such as a portion of SRAM array 100, in portion or entirety, that can be implemented to improve SRAM performance according to various aspects of the present disclosure. FIG. 6B is a diagrammatic cross-sectional view of SRAM cell 110A of SRAM array 100, in portion or entirety, along line B-B of FIG. 6A according to various aspects of the present disclosure. FIG. 6C is a diagrammatic cross-sectional view of SRAM cell 110A of SRAM array 100, in portion or entirety, along line C-C of FIG. 6A according to various aspects of the present disclosure. In FIGS. 6A-6C, pull-down transistors PD-1, PD-2, pull-up transistors PU-1, PU-2, and pass-gate transistors PG-1, PG-2 have a same channel length L along the lengthwise direction of active regions of SRAM array 100 (i.e., the y-direction). In some embodiments, channel length L is about 5 nm to about 20 nm. In some embodiments, channel length L is a length of semiconductor layers (i.e., channel layers) of the transistors of an SRAM cell between a respective source and a respective drain of the transistors (e.g., respective epitaxial source/drain features). In some embodiments, the channel length L is substantially the same to a width of gate lines 220A-220H along the y-direction. FIGS. 6A-6C have been simplified for the sake of clarity to better understand the inventive concepts of the present disclosure. Additional features can be added in SRAM array 100 of FIGS. 6A-6C, and some of the features described herein can be replaced, modified, or eliminated in other embodiments of SRAM array 100 of FIGS. 6A-6C.

Active regions in the depicted SRAM layout are arranged such that n-type active regions 210A-210C are disposed between p-type active region 212A and p-type active region 212B, p-type active region 212A is directly adjacent to and spaced the same distance from n-type active region 210A and n-type active region 210C along the lengthwise direction of gate lines 220A-220H (i.e., the x-direction), p-type active region 212B is directly adjacent to and spaced a distance from n-type active region 210B along the lengthwise direction of gate lines 220A-220H, and n-type active region 210B is disposed directly adjacent to and spaced the same distance from n-type active region 210A and n-type active region 210C along the lengthwise direction of gate lines 220A-220H. In the depicted embodiment, other active regions are not disposed between directly adjacent active regions. For example, no active regions are disposed in a space between p-type active region 212A and n-type active region 210A, a space between p-type active region 212A and n-type active region 210C, or a space between p-type active region 212B and n-type active region 210B. Since SRAM cell 110B is a mirror image of SRAM cell 110A along the x-axis and SRAM cell 110B and SRAM cell 110A share p-type active region 212A and p-type active region 212B, p-type active region 212A has a PG transistor portion disposed between PD transistor portions, where the PG transistor portion forms a portion of pass-gate transistor PG-1 of SRAM cell 110A and a portion of pass-gate transistor PG-1 of SRAM cell 110B and the PD transistor portions form a portion of pull-down transistor PD-1 of SRAM cell 110A and a portion of pull-down transistor PD-1 of SRAM cell 110B, respectively. PG transistor portion of p-type active region 212A spans a cell boundary interface between SRAM cell 110A and SRAM cell 110B. In contrast, p-type active region 212B has a PD transistor portion disposed between PG transistor portions, where the PD transistor portion forms a portion of pull-down transistor PD-2 of SRAM cell 110A and a portion of pull-down transistor PD-2 of SRAM cell 110B and the PG transistor portions form a portion of pass-gate transistor PG-2 of SRAM cell 110A and a portion of pass-gate transistor PG-2 of SRAM cell 110B, respectively. PD transistor portion of p-type active region 212B also spans the cell boundary interface between SRAM cell 110A and SRAM cell 110B. PU transistor active regions (here, n-type active regions 210A-210C) are disposed between p-type active region 212A and p-type active region 212B, and in the depicted embodiment, n-type active region 210B is shared by SRAM cell 110A and SRAM cell 110B, spans the cell boundary interface between SRAM cell 110A and SRAM cell 110B, and forms a portion of pull-up transistor PU-2 of SRAM cell 110A and a portion of pull-up transistor PU-2 of SRAM cell 110B.

To improve SRAM performance, the present disclosure proposes modifying a layout of SRAM array 100 to configure p-type active regions, such as p-type active region 212A and p-type active region 212B, with widths that increase a β ratio of SRAM cell 110A and/or SRAM cell 110B and/or decrease a threshold voltage of pull-down transistors of SRAM cell 110A and/or SRAM cell 110B. For example, widths of PD transistor portions of p-type active regions are enlarged with respect to widths of PG transistor portions of p-type active regions, such that p-type active regions have widths that vary along their lengths, instead of having substantially uniform widths along their lengths, such as depicted in FIG. 3. In FIGS. 6A-6C, PG transistor portions of p-type active region 212A and p-type active region 212B have a width W1 along the x-direction and are spaced from a respective, directly adjacent n-type active region, such as one of n-type active regions 210A-210C, by distance S1 along the x-direction, and n-type active regions 210A-210C have a width W2 along the x-direction. In the depicted embodiment, width W1 is greater than width W2, width W2 is substantially uniform along lengths of n-type active regions 210A-210C, and p-type active region 212A and p-type active region 212B are modified to have varying widths along their lengths. For example, active region extensions 230A and active region extensions 230B (also both referred to as jogs) are added to both sides of PD transistor portions of p-type active region 212A and p-type active region 212B to enlarge a width of PD transistor portions with respect to PG transistor portions from width W1 to a width W1' along the x-direction, such that p-type active region 212A has wide ends and a narrow center and p-type active region 212B has narrow ends and a wide center. Enlargement of the width of PD transistor portions is tuned to provide a ratio of a width of PD transistor portions to a width of PG transistor portions that is greater than 1. In some embodiments, the ratio of the width of PD transistor portions to the width of PG transistor portions is about 1.1 to about 1.4, which ratio is further explained below with regard to improving SRAM performance. In some embodiments, width W1' is about 1 nm to about 4 nm greater than width W1. In some embodiments, width W1' is about 5 nm to about 50 nm. In some embodiments, width W1 is about 5 nm to about 50 nm.

Active region extensions 230A have a width W3 along the x-direction, and active region extensions 230B have a width W4 along the x-direction. Active region extensions 230A and active region extensions 230B extend PD transistor portions beyond first sidewalls of PG transistor portions by width W3 and beyond second sidewalls of PG transistor portions by width W4, where width W1 is between the first sidewalls and the second sidewalls of PG transistor portions. In the depicted embodiment, first sides of PD transistor portions of p-type active region 212A and p-type active region 212B are directly adjacent to n-type active regions, such that active region extensions 230A decrease a spacing between PD transistor portions of p-type active region 212A and p-type active region 212B and directly adjacent n-type active regions, such as n-type active regions 210A-210C. For example, p-type active region 212A is spaced from n-type active region 210A by a distance S2 along the x-direction, where distance S2 is less than distance S1. In some embodiments, width W3 is about 1 nm to about 2 nm and/or width W4 is about 1 nm to about 2 nm. In the depicted embodiment, width W3 is substantially the same as width W4. In some embodiments, width W3 is different than width W4. In the depicted embodiment, active region extensions 230A and active region extensions 230B extend an entirety of lengths of PD transistor portions. In some embodiments, active region extensions 230A and/or active region extensions 230B extend partially along lengths of PD transistor portions. In the depicted embodiment, all active region extensions 230A have width W3 and all active region extensions 230B have width W4. In some embodiments, active region extensions 230A and/or active region extensions 230B can have different widths along different PD transistor portions. For example, for p-type active region 212A, width W3 of active region extension 230A added to PD transistor portion in SRAM cell 110A may be different than width W3 of active region extension 230A added to PD transistor portion in SRAM cell 110B and/or width W4 of active region extension 230B added to PD transistor portion in SRAM cell 110A may be different than width W4 of active region extension 230B added to PD transistor portion in SRAM cell 110B. In another example, in SRAM cell 110A and/or SRAM cell 110B, width W3 and/or width W4 of active region extension 230A and active region extension 230B, respectively, added to PD transistor portion of p-type active region 212A may be different than width W3 and/or width W4 of active region extension 230A and active region extension 230B, respectively, added to PD transistor portion of p-type active region 212B. In some embodiments, active region extensions 230A, but not active region extensions 230B, are added to PD transistor portions. In some embodiments, active region extensions 230B, but not active region extensions 230A, are added to PD transistor portions.

Enlarging widths of PD transistor portions of p-type active regions with respect to PG transistor portions of p-type active regions provides channel widths for pull-down transistors that are greater than channel widths of pass-gate transistors. For example, channel regions of p-type active region 212A and p-type active region 212B in PG transistor portions are formed by stacks of semiconductor layers 240A vertically stacked along the z-direction over mesa structures 202A', such as depicted for pass-gate transistor PG-1 of SRAM cell 110A in FIG. 6B, and channel regions of p-type active region 212A and p-type active region 212B in PD transistor portions are formed by stacks of semiconductor layers 240B vertically stacked along the z-direction over mesa structures 202B', such as depicted for pull-down transistor PD-2 of SRAM cell 110A. Semiconductor layers 240A and semiconductor layers 240B provide pass-gate transistors PG-1, PG-2 and pull-down transistors PD-1, PD-2, respectively, with channels and are thus also referred to as channel layers. Mesa structures 202A' and mesa structures 202B' are extensions of substrate 202 having width W1 and width W1', respectively. Semiconductor layers 240A have a width W5 along the x-direction (i.e., a channel width), and semiconductor layers 240B have a width W5' along the x-direction (i.e., a channel width).

Width W5' is enlarged with respect to width W5, such that width W5' is greater than width W5. In some embodiments, a ratio of width W5' to a ratio of width W5 is about 1.1 to about 1.4 to optimize a β ratio and/or a threshold voltage difference between the pull-down transistors and the pass-gate transistors of SRAM cell 110A and/or SRAM cell 110B, such as described herein and further below, thereby improving performance of SRAM cell 110A and/or SRAM cell 110B. In the depicted embodiment, width W5 is substantially the same as width W1, and width W5' is substantially the same as width W1'. In some embodiments, width W5 and/or width W5' are different than width W1 and/or width W1', respectively, but width W5' remains larger than width W5 and a ratio of width W5' to width W5 provides desired performance characteristics (e.g., β ratio greater than one and/or threshold voltage differences that improve read stability). For example, processing associated with forming semiconductor layers 240A and/or semiconductor layers 240B, such as etching during a channel release process, may decrease their widths relative to mesa structures 202A' and mesa structures 202B', respectively. In another example, semiconductor layers 240A and/or semiconductor layers 240B undergo processing to obtain desired profiles, which intentionally reduce widths of semiconductor layers 240A and/or semiconductor layers 240B relative to mesa structures 202A' and mesa structures 202B', respectively. In the depicted embodiment, channel widths of pull-down transistors PD-1, PD-2 (width W5') are greater than channel widths of pass-gate transistors PG-1, PG-2 (width W5), while channel lengths of pull-down transistors PD-1, PD-2 are substantially the same as channel lengths of pass-gate transistors PG-1, PG-2. Channel lengths of pull-down transistors PD-1, PD-2 are a length of semiconductor layers 240A along the y-direction, and channel lengths of pass-gate transistors PG-1, PG-2 are a length of semiconductor layers 240B along the y-direction. In some embodiments, channel lengths of pull-down transistors PD-1, PD-2 are different than channel lengths of pass-gate transistors PG-1, PG-2.

Enlargement of the width of PD transistor portions relative to the width of PG transistor portions thus provides enlargement of an effective channel width of pull-down transistors to an effective channel width of pass-gate transistors. Accordingly, widths of PD transistor portions can be tuned to optimize a β ratio of pull-down transistors and pass-gate transistors of SRAM array 100. For example, width W1' is enlarged relative to width W1 (which correspondingly enlarges pull-down transistor channel width (e.g., width W5') relative to pass-gate transistor channel width (e.g., width W5)) to provide PD/PG transistor pairs of SRAM cell 110A and/or SRAM cell 110B with β ratios that are greater than 1 (i.e., β >1) which improves read stability and overall performance of SRAM cell 110A and/or SRAM cell 110B. In some embodiments, β ratio of SRAM cell 110A and/or SRAM cell 110B is about 1.1 to about 1.4, which is sufficiently large to reduce the pass-gate transistors effect on the latches of SRAM cell 110A and/or SRAM cell 110B during read operations, thereby improving read stability of the latches (i.e., the SRAM cell's state can be read without disturbing the latches, such as causing the latch states to flip). β ratios less than 1.1 may not provide sufficient read stability improvements and β ratios greater than 1.4 may cause enlarged active regions to encroach into a minimum spacing between active regions, necessitate a spacing that cannot be accommodated by patterning process windows (e.g., an etching process and/or a lithography process may not be capable of providing the spacing between active regions that results from the enlargement), and/or necessitate enlargement of a footprint of SRAM cell 110A and/or SRAM cell 110B, which is not desired when shrinking memory cell sizes. In some embodiments, configuring a ratio of width W1' to width W1 that is about 1.1 to about 1.4 provides SRAM cell 110A and/or SRAM cell 110B with a β ratio of about 1.1 to about 1.4. Enlarging p-type active fins by adding active region extensions to both sides of PD transistor portions, instead of a single side, facilitates upsizing of pull-down transistor width (and thus increasing of on-current of the pull-down transistor and corresponding β ratio) without significant area penalty or without increasing a channel length of the pass-gate transistors, which can decrease write stability of an SRAM cell. For example, since width W2 is limited by a minimum spacing needed between p-type active region 212A and/or p-type active region 212B and directly adjacent n-type active regions, active region extensions 230B provide greater design flexibility for achieving desired β ratios and/or other performance characteristics without enlarging a footprint of SRAM cell 110A and/or SRAM cell 110B or impacting scaled channel length. In some embodiments, where cell width Sx is about 100 nm to about 300 nm and cell height Sy is about 50 nm to about 150 nm, width W3 and/or width W4 are about 1 nm to about 2 nm, where widths less than 1 nm may not result in meaningful on-current differences between pull-down transistors and pass-gate transistors and widths greater than 2 nm may encroach into a minimum spacing between active regions and/or necessitate enlargement of a footprint of SRAM cell 110A and/or SRAM cell 110B, such as an enlargement of cell width Sx. In some embodiments, spacing S1 is about 30 nm to about 50 nm and/or spacing S2 is about 28 nm to about 48 nm. In some embodiments, spacing S2 is less than about 25 nm to provide adequate spacing between active regions.

Figure 7:
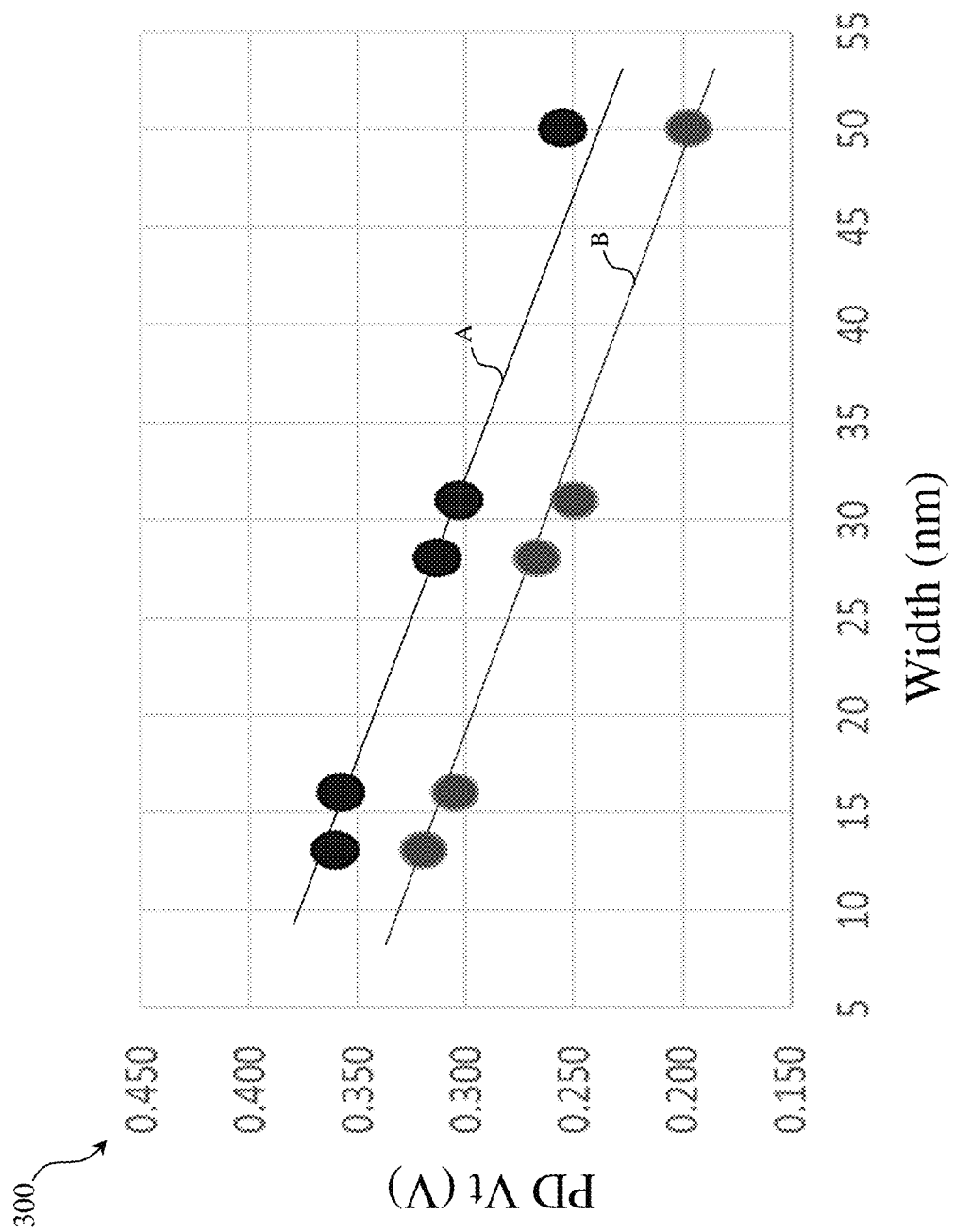
FIG. 7 is an exemplary plot of a threshold voltage of a pull-down transistor as a function of channel width of the pull-down transistor according to various aspects of the present disclosure.

As channel dimensions scale in SRAMs, random dopant fluctuations have become a significant cause of threshold voltage variations in transistors of the SRAM, particularly since threshold voltage is inversely proportional to channel area (i.e., threshold voltage decreases as channel area increases). SRAM designs for setting and controlling threshold voltages using physical characteristics of the transistors, such as channel dimensions, instead of using doping differences of the transistors, are desired to minimize threshold voltage variations and improve read margins. Enlargement of the width of PD transistor portions relative to the width of PG transistor portions, as described herein, provides such benefits by providing corresponding enlargement of an effective channel width of pull-down transistors to an effective channel width of pass-gate transistors. Accordingly, widths of PD transistor portions can be tuned to optimize a threshold voltage difference between pull-down transistors and pass-gate transistors of SRAM array 100 and/or modify a threshold voltage of pull-down transistors. For example, FIG. 7 is an exemplary plot 300 of a threshold voltage of a pull-down transistor (PD Vt in volts (V)) as a function of effective channel width of the pull-down transistor (in nanometers (nm)) according to various aspects of the present disclosure. As evident from a line A corresponding with a first pull-down transistor and a line B corresponding with a second pull-down transistor in plot 300, threshold voltage of a pull-down transistor decreases as effective channel width increases. The principles described herein can thus be implemented to tune a threshold voltage of pull-down transistors. For example, width W1' is enlarged relative to width W1 to provide a pull-down transistor threshold voltage (Vt-PD) that is less than a pass-gate transistor threshold voltage (Vt-PG) to improve read margins and overall performance of SRAM cell 110A and/or SRAM cell 110B. In some embodiments, a pull-down transistor threshold voltage is about 30 mV to about 70 mV less than a pass-gate transistor threshold voltage. In some embodiments, configuring a ratio of width W1' to width W1 that is about 1.1 to about 1.4 provides SRAM cell 110A and/or SRAM cell 110B with a pull-down transistor threshold voltage that is about 30 mV to about 70 mV less than a pass-gate threshold voltage. Threshold voltage differences that are less than 30 mV may not provide sufficient read stability improvements and β ratios greater than 1.4 may require additional circuitry for assisting and/or enabling operation, such as read operation and/or write operation. Enlarging the width W1' with respect to width W1 thus provides for threshold voltage adjustments of the pull-down transistors without increasing an overall footprint of SRAM array 100.

Returning to FIG. 6B and FIG. 6C, channel regions of n-type active regions 210A-210C are also formed by stacks of semiconductor layers, such as semiconductor layers 240C vertically stacked along the z-direction over mesa structures 202C', such as depicted for pull-up transistor PU-2 of SRAM cell 110A in FIG. 6B, and semiconductor layers 240D vertically stacked along the z-direction over mesa structures 202D', such as depicted for pull-up transistor PU-1 of SRAM cell 110A. Semiconductor layers 240C and semiconductor layers 240D provide pull-up transistors PU-1, PU-2, respectively, with channels and are thus also referred to as channel layers. Mesa structures 202C' and mesa structures 202D' are extensions of substrate 202 having width W2, and semiconductor layers 240C and semiconductor layers 240D have a width W6 along the x-direction (i.e., a channel width) that is less than width W5 of semiconductor layers 240A. In the depicted embodiment, width W6 is substantially the same as width W2. In some embodiments, width W6 is different than width W2. For example, processing associated with forming semiconductor layers 240C and/or semiconductor layers 240D, such as etching during a channel release process, may decrease their widths relative to mesa structures 202C' and mesa structures 202D', respectively. In another example, semiconductor layers 240C and/or semiconductor layers 240D undergo processing to obtain desired profiles, which intentionally reduce widths of semiconductor layers 240C and/or semiconductor layers 240D relative to mesa structures 202C' and mesa structures 202D', respectively. In the depicted embodiment, pull-up transistors PU-1, PU-2 have a same channel width (e.g., width W6) and a same channel length (e.g., channel length L). In some embodiments, pull-up transistors PU-1, PU-2 have different channel widths and/or different channel lengths. In some embodiments, the present disclosure contemplates adjusting channel widths of pull-up transistors PU-1, PU-2 relative to channel widths of pass-gate transistors PG-1, PG-2 by modifying n-type active regions 210A-210C, such as described herein. For example, write stability of an SRAM cell depends on an alpha (α) ratio of the SRAM cell, which refers to a ratio of an on (drive) current of a pull-up transistor ($I_{on-PU}$) to an on (drive) current of a pass-gate transistor ($I_{on-PG}$) (i.e., $\alpha = I_{on-PU}/I_{on-PG}$). Using the principles described herein, the active region layout of SRAM array 100 can further be modified to increase widths of n-type active regions 210A-210C relative to widths of PG transistor portions of p-type active region 212A and/or p-type active region 212B, such that an effective channel width (and on-current) of pull-up transistors PU-1, PU-2 is increased relative to an effective channel width (and on-current) of pass-gate transistors PG-1, PG-2, thereby desirably increasing an α ratio of SRAM cell 110A and/or SRAM cell 110B and improving write stability and overall performance of SRAM array 100. In such embodiments, pull-up transistors PU-1, PU-2 and pass-gate transistors PG-1, PG-2 may have a same channel length, though the present disclosure contemplates embodiments where pull-up transistors PU-1, PU-2 and pass-gate transistors PG-1, PG-2 have different channel lengths.

Semiconductor layers 240A-240D and mesa structures 202A'-202D' include a semiconductor material, such as silicon, germanium, silicon germanium, silicon carbide, gallium arsenide, gallium phosphide, indium phosphide, indium arsenide, indium antimonide, GaAsP, AlInAs, AlGaAs, GaInAs, GaInP, GaInAsP, or combinations thereof. In some embodiments, n-wells 206A and/or p-wells 206B are further disposed in mesa structures 202A'-202D'. In some embodiments, semiconductor layers 240A-240D include n-type dopants (e.g., phosphorus, arsenic, other n-type dopant, or combinations thereof) and/or p-type dopants (e.g., boron, indium, other p-type dopant, or combinations thereof). In some embodiments, semiconductor layers 240A-240D have nanometer-sized dimensions and can be referred to as "nanostructures," alone or collectively. The present disclosure also contemplates embodiments where semiconductor layers 240A-240D have sub-nanometer dimensions and/or greater than nanometer dimensions. Semiconductor layers 240A-240D can have cylindrical-shaped profiles (e.g., nanowires), rectangular-shaped profiles (e.g., nanobars), sheet-shaped profiles (e.g., nanosheets (e.g., dimensions in the X—Y plane are greater than dimensions in the X-Z plane and the Y-Z plane to form sheet-like structures)), or any other suitable shaped profile. In the depicted embodiment, semiconductor layers 240A-240D have channel widths (e.g., width W5, width W5', or width W6) that are sufficiently greater than their channel lengths (e.g., channel length L), such that semiconductor layers 240A-240D have sheet-like profiles. In such embodiments, semiconductor layers 240A-240D can be referred to as nanosheets and/or sheet-like channels.

Each stack of semiconductor layers 240A-240D extends between respective epitaxial source/drain features along the y-direction. For example, semiconductor layers 240A and semiconductor layers 240B extend between epitaxial source/drain features 250A and semiconductor layers 240C and semiconductor layers 240D extend between epitaxial source/drain features 250B. Epitaxial source/drain features 250A and epitaxial source/drain features 250B have different compositions. In the depicted embodiment, epitaxial source/drain features 250A form portions of n-type GAA transistors and epitaxial source/drain features 250B form portions of p-type GAA transistors. In such embodiments, epitaxial source/drain features 250B include silicon germanium or germanium, which can be doped with boron, other p-type dopant, or combinations thereof. In furtherance of such embodiments, epitaxial source/drain features 250A include silicon, which can be doped with carbon, phosphorous, arsenic, other n-type dopant, or combinations thereof. In some embodiments, epitaxial source/drain features 250A and/or epitaxial source/drain features 250B include more than one epitaxial semiconductor layer, where the epitaxial semiconductor layers include the same or different materials and/or the same or different dopant concentrations. In some embodiments, epitaxial source/drain features 250A and/or epitaxial source/drain features 250B include materials and/or dopants that achieve desired tensile stress and/or compressive stress in semiconductor layers 240A-240D.

As noted above, gate lines 220A-220H can each include a metal gate and gate spacers disposed along sidewalls of the metal gate. Metal gates are disposed over channel regions of active regions (i.e., respective semiconductor layers 240A-240D) and are further disposed between respective source/drain regions of active regions (i.e., epitaxial source/drain features 250A, 250B). Metal gates (also referred to as metal gate stacks and/or high-k/metal gates) are configured to achieve desired functionality according to design requirements of SRAM array 100. Each metal gate includes a gate dielectric (e.g., a gate dielectric layer) and a gate electrode (e.g., a work function layer and a bulk conductive layer) formed over the gate dielectric. For example, in FIG. 6B, gate line 220C includes a metal gate having a gate dielectric 255A and a gate electrode 260A, and gate line 220B includes a metal gate having a gate dielectric 255B and a gate electrode 260B. Metal gates may include numerous other layers, such as capping layers, interface layers, diffusion layers, barrier layers, hard mask layers, or combinations thereof. In the X-Z plane, metal gates of gate line 220C and gate line 220B cover top surfaces, bottom surfaces, and sidewalls of respective semiconductor layers 240A-240D, such that each of semiconductor layers 240A-240D is wrapped and/or surrounded by a respective metal gate. For example, metal gate of gate line 220C surrounds semiconductor layers 240A, and metal gate of gate line 220B surrounds semiconductor layers 240B-240D. Metal gate of gate line 220C engages semiconductor layers 240A, such that current can flow between respective epitaxial source/drain features 250A, respectively, during operation. Metal gate of gate line 220B engages semiconductor layers 240B and semiconductor layers 240C, such that current can flow between respective epitaxial source/drain features 250A and respective epitaxial source/drain features 250B, respectively, during operation. Since metal gates may span different transistor regions of SRAM array, such as metal gate of gate line 220B that spans pull-up transistors PU-1, PU-2 and pull-down transistor PD-2, metal gates may have different layers in the different transistor regions. For example, a number, configuration, and/or materials of layers of gate dielectric 255B and/or gate electrode 260B of gate line 220A corresponding with a pull-up transistor region (e.g., pull-up transistors PU-1, PU-2) may be different than a number, configuration, and/or materials of layers of gate dielectric 255B and/or gate electrode 260B of gate line 220A corresponding with a pull-down transistor region (e.g., pull-down transistor PD-2).

Gate dielectrics of metal gates, such as gate dielectric 255A and/or gate dielectric 255B, include a high-k dielectric layer, which includes a high-k dielectric material, which refers to a dielectric material having a dielectric constant that is greater than that of silicon dioxide. For example, the high-k dielectric layer includes $HfO_2$, HfSiO, $HfSiO_4$, HfSiON, HfLaO, HfTaO, HfTiO, HfZrO, HfAlO, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $Ba_7rO$, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material for metal gate stacks, or combinations thereof. In some embodiments, gate dielectrics include an interfacial layer disposed between the high-k dielectric layer and semiconductor layers 240A-240D. The interfacial layer includes a dielectric material, such as $SiO_2$, HfSiO, SiON, other silicon-comprising dielectric material, other suitable dielectric material, or combinations thereof.

Gate electrodes of metal gates, such as gate electrode 260A and/or gate electrode 260B, include a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes include a work function layer and a bulk conductive layer. The work function layer can be a metal layer tuned to have a desired work function (e.g., an n-type work function or a p-type work function), and the bulk layer can be a bulk metal layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$ other suitable p-type work function materials, or combinations thereof. In some embodiments, pass-gate transistor PG-1 and pull-down transistor PD-1 have metal gates with the same work function, and pass-gate transistor PG-2 and pull-down transistor PD-2 have metal gates with the same work function. In such embodiments, operational differences between the pull-down transistors and the pass-gate transistors, such as on-current differences and/or threshold voltage differences, are obtained solely by modifying p-type active region 212A and/or p-type active region 212B. The bulk (or fill) conductive layer includes a suitable conductive material, such as Al, W, Ti, Ta, polysilicon, Cu, metal alloys, other suitable materials, or combinations thereof.

Various isolation structures are provided in SRAM array 100. For example, isolation features 270 isolate active regions from other active device regions and/or passive device regions of SRAM array 100 and/or other active device regions and/or passive device regions of an IC to which the SRAM array 100 belongs. In some embodiments, isolation features 270 surround mesa structures 202A'-202D' of active regions of SRAM array 100 (e.g., n-type active regions 210A-210C, p-type active region 212A, and p-type active region 212B). In another example, gate isolation features 275 separate adjacent gate lines 220A-220H from one another and/or gate isolation features 280 separate metal gates corresponding with different transistors of gate lines 220A-220H. Isolation features 270, gate isolation features 275, and/or gate isolation features 280 include silicon oxide, silicon nitride, silicon oxynitride, other suitable isolation material (for example, including silicon, oxygen, nitrogen, carbon, or other suitable isolation constituent), or combinations thereof. In some embodiments, isolation features 270 gate isolation features 275, and/or gate isolation features 280 have a multi-layer structure. Isolation features 270 can be configured as shallow trench isolation (STI) structures, deep trench isolation (DTI) structures, local oxidation of silicon (LOCOS) structures, and/or other suitable isolation structures.

SRAM array 100 can further include an inter-level dielectric (ILD) layer 290 over isolation features 270, epitaxial source/drain features 250A, and epitaxial source/drain features 250B. In some embodiments, ILD layer 290 is disposed between adjacent gate lines 220A-220H. ILD layer 290 includes a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 290 is a dielectric layer that includes a low-k dielectric material (generally referred to as a low-k dielectric layer). ILD layer 290 can include a multilayer structure having multiple dielectric materials. In some embodiments, a contact etch stop layer (CESL) is disposed between ILD layer 290 and isolation features 270, epitaxial source/drain features 250A, and epitaxial source/drain features 250B. The CESL includes a material different than ILD layer 290, such as a dielectric material that is different than the dielectric material of ILD layer 290. For example, where ILD layer 290 includes a low-k dielectric material, the CESL includes silicon and nitrogen, such as silicon nitride or silicon oxynitride.

SRAM array 100 can further include various contacts to facilitate operation of the various transistors. For example, one or more ILD layers, similar to ILD layer 290, and/or CESL layers can be formed over substrate 202. Contacts can then be formed in ILD layer 290 and/or ILD layers disposed over ILD layer 290. For example, contacts are respectively electrically and/or physically coupled with gate lines 220A-220H and contacts are respectively electrically and/or physically coupled to epitaxial source/drain features 250A and epitaxial source/drain features 250A to provide an SRAM circuit, such as depicted in FIG. 4 and/or FIG. 5. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some embodiments, ILD layer 290, ILD layers disposed over ILD layer 290, and the contacts (for example, disposed in ILD layer 290 and/or the other ILD layers) are a portion of a multilayer interconnect (MLI) feature. The MLI feature electrically couples various devices (for example, transistors, resistors, capacitors, and/or inductors) and/or components (for example, gate structures and/or epitaxial source/drain features), such that the various devices and/or components can operate as specified by design requirements of SRAM array 100. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of SRAM array 100 and/or distribute signals (for example, clock signals, voltage signals, and/or ground signals) to the devices and/or the components of SRAM array 100.

Figure 8:
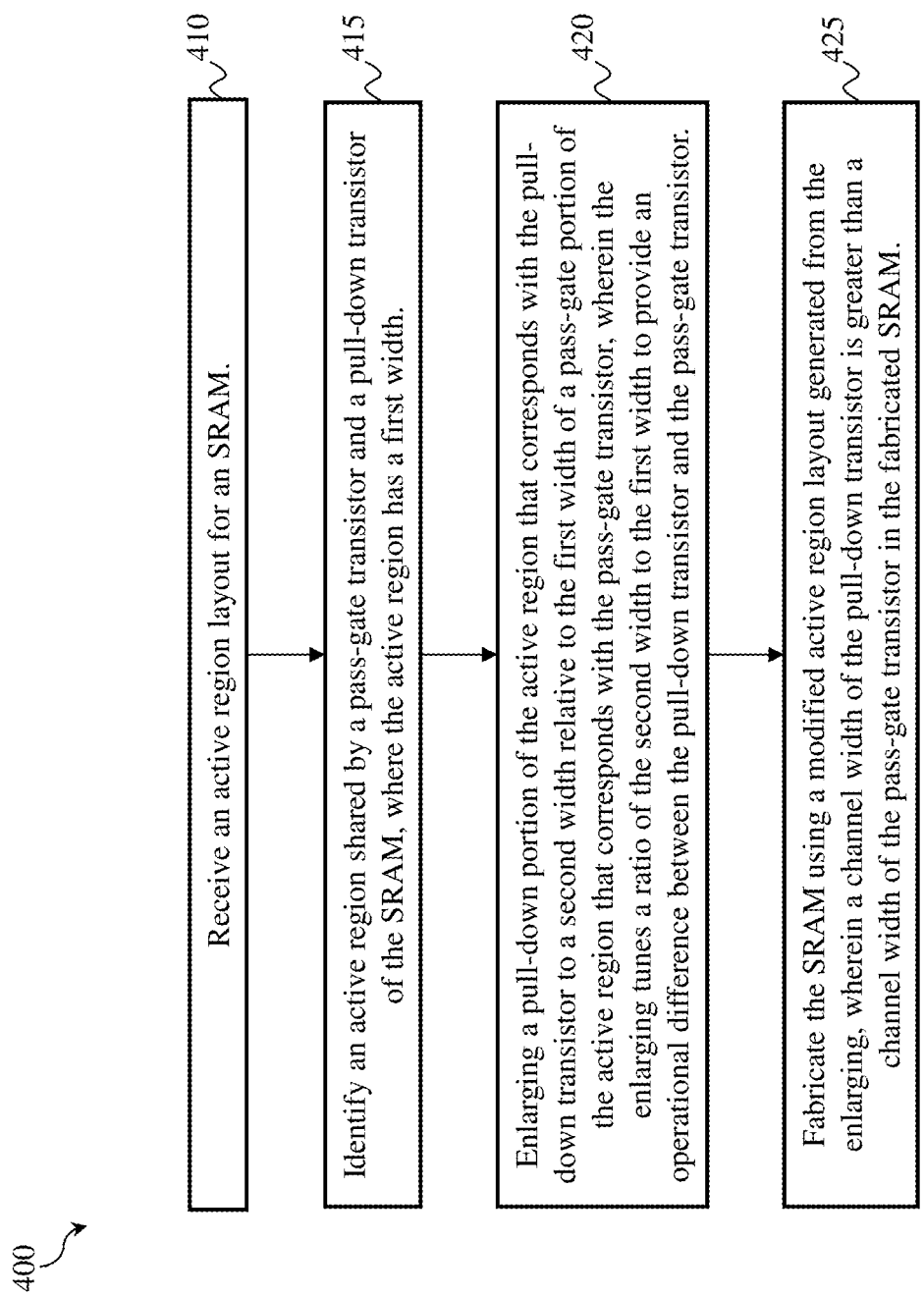
FIG. 8 is a flow chart of a method that can be implemented for memory design and/or memory fabrication according to various aspects of the present disclosure.

FIG. 8 is a flow chart of a method 400 that can be implemented for memory design and/or memory fabrication according to various aspects of the present disclosure. Method 400 implements the concepts described herein to optimize memory performance. Method 400 beings at block 410 and block 415 with receiving an active region layout for a memory, such as an SRAM, and identifying a shared active region in the active region layout, respectively. The shared active region is shared by more than one transistor of the memory (e.g., forms a portion of two transistors), and the shared active region has a first width along an entirety of a length of the shared active region. In some embodiments, the shared active region is shared by a pass-gate GAA transistor and a pull-down GAA transistor of a memory cell, such as an SRAM memory cell. In such embodiments, the shared active region has a pull-down portion that corresponds with the pull-down GAA transistor and a pass-gate portion that corresponds with the pass-gate GAA transistor. Method 400 can proceed to block 420 by enlarging the pull-down portion of the active region relative to the pass-gate portion of the active region. For example, the pull-down portion of the active region is enlarged from the first width to a second width, thereby modifying the shared active region in a manner that provides the shared active region with a width that varies along its length. The enlarging tunes a ratio of the second width to the first width to provide an operational difference between the pull-down GAA transistor and the pass-gate GAA transistor. In some embodiments, a modified active region layout is generated by enlarging the pull-down portion of the active region. Method 400 can proceed to block 425, where a memory, such as an SRAM, is fabricated using the modified active region layout. For example, a fabricated SRAM has a pull-down GAA transistor and a pass-gate GAA transistor, where a channel width of the pull-down GAA transistor is greater than a channel width of the pass-gate GAA transistors. Additional steps can be provided before, during, and after method 400, and some of the steps described can be moved, replaced, or eliminated for additional embodiments of method 400.

SRAM designs based on GAA transistors are disclosed that provide flexibility for increasing channel widths of transistors at scaled IC technology nodes and relax limits on SRAM performance optimization imposed by FinFET-based SRAMs. GAA-based SRAM cells described herein have active region layouts with active regions shared by pull-down GAA transistors and pass-gate GAA transistors. A width of shared active regions that correspond with the pull-down GAA transistors are enlarged with respect to widths of the shared active regions that correspond with the pass-gate GAA transistors. A ratio of the widths is tuned to obtain ratios of pull-down transistor effective channel width to pass-gate effective channel width greater than 1, increase an on-current of pull-down GAA transistors relative to an on-current of pass-gate GAA transistors, decrease a threshold voltage of pull-down GAA transistors relative to a threshold voltage of pass-gate GAA transistors, and/or increases a β ratio of an SRAM cell.

An exemplary memory cell structure includes a first pull-down (PD) gate-all-around (GAA) transistor, a second PD GAA transistor, a first pass-gate (PG) GAA transistor, and a second PG GAA transistor having a shared active semiconductor region. The shared active semiconductor region extends along a first direction, the first PD GAA transistor and the first PG GAA transistor belong to a first memory cell, and the second PD GAA transistor and the second PG GAA transistor belong to a second memory cell adjacent to the first memory cell. The shared active semiconductor region has a PG active portion that corresponds with the first PG GAA transistor and the second PG GAA transistor and a PD active portion adjacent to the PG active portion that corresponds with the first PD GAA transistor and the second PD GAA transistor. The first PD GAA transistor and the first PG GAA transistor each have a first channel length and the second PD GAA transistor and the second PG GAA transistor each have a second channel length. The first channel length and the second channel length are along the first direction. The PG active portion has a width W1 along a second direction and the PD active portion has a width W1' along the second direction. The second direction is perpendicular to the first direction. The width W1' is enlarged with respect to the width W1 by an enlargement width to provide the first PD GAA transistor and the second PD GAA transistor with a first channel width along the second direction and a first threshold voltage and the first PG GAA transistor and the second PG GAA transistor with a second channel width along the second direction and a second threshold voltage. The first channel width is greater than the second channel width and the first threshold voltage is less than the second threshold voltage. In some embodiments, a ratio of width W1' to width W1 provides each of the first memory cell and the second memory cell with a beta ratio that is about 1.1 to about 1.4. In some embodiments, a difference between the first threshold voltage and the second threshold voltage is about 30 mV to about 70 mV. In some embodiments, the enlargement width is about 1 nm to about 4 nm. In some embodiments, the first channel width is the same as the width W1' and the second channel width is the same as the width W1. In some embodiments, the first channel width is less than the width W1' and the second channel width is less than the width W1. In some embodiments, a first work function of a first metal gate of the first PD GAA transistor is the same as a second work function of a second metal gate of the first PG GAA transistor.

In some embodiments, the PD active portion of the shared active semiconductor region has a first extension portion having a width W2 and a second extension portion having a width W3. In such embodiments, the PD active portion of the shared active semiconductor region extends beyond a first sidewall of the PG active portion of the shared active semiconductor region along the second direction by the width W2 and beyond a second sidewall of the PG active portion of the shared active semiconductor region along the second direction by the width W3, the width W1 is between the first sidewall of the PG active portion and the second sidewall of the PG active portion, and the width W1' is a sum of the width W1, the width W2, and the width W3.

In some embodiments, the shared active semiconductor region is a first active semiconductor region, and the memory cell structure further includes a pull-up GAA transistor having a second active semiconductor region that extends along the first direction and is directly adjacent to the first active semiconductor region. In such embodiments, a first spacing along the second direction between the PG active portion of the first active semiconductor region and the second active semiconductor region is greater than a second spacing along the second direction between the PD active portion of the first active semiconductor region and the second active semiconductor region. In some embodiments, the second active semiconductor region has a width W2 along the second direction that is less than width W1.

In some embodiments, the PD portion of the shared active semiconductor region includes a first PD active portion and a second PD active portion, and the PG active portion is disposed between the first PD active portion and the second PD active portion. In such embodiments, the first PD active portion corresponds with the first PD GAA transistor, the second PD active portion corresponds with the second PD GAA transistor, and the first PD active portion and the second PD active portion have the width W1'. In some embodiments, the PG portion of the shared active semiconductor region includes a first PG active portion and a second PG active portion, and the PD active portion is disposed between the first PG active portion and the second PG active portion. In such embodiments, the first PG active portion corresponds with the first PG GAA transistor, the second PG active portion corresponds with the second PG GAA transistor, and the first PG active portion and the second PG active portion have the width W1.

Another memory cell structure includes a first active semiconductor region, a second active semiconductor region, a third active semiconductor region, and a fourth active semiconductor region that extend substantially parallel along a first direction. A first pull-up (PU) GAA transistor includes the second active semiconductor region and a second PU GAA transistor includes the third active semiconductor region. A first pass-gate (PG) GAA transistor and a first pull-down (PD) GAA transistor share the first active semiconductor region. The first active semiconductor region has a first PD portion disposed over a first PG portion along the first direction, the first PD portion corresponds with the first PD GAA transistor, and the first PG portion corresponds with the first PG GAA transistor. A second PG GAA transistor and a second PD GAA transistor share the fourth active semiconductor region. The fourth active semiconductor region has a second PG portion disposed over a second PD portion along the first direction, the second PG portion corresponds with the second PG GAA transistor, and the second PD portion corresponds with the second PD GAA transistor. The first PG portion of the first active semiconductor region has a width W1 between a first sidewall and a second sidewall, and the second PG portion of the fourth active semiconductor region has a width W2 between a third sidewall and a fourth sidewall. The width W1 and the width W2 are along a second direction that is perpendicular to the first direction. The first PD portion of the first active semiconductor region has a width W1' along the second direction that is enlarged with respect to width W1. The first PD portion extends beyond the first sidewall and the second sidewall of the first PG portion of the first active semiconductor region. The second PD portion of the fourth active semiconductor region has a width W2' that is enlarged with respect to width W2. The second PD portion extends beyond the third sidewall and the fourth sidewall of the second PG portion of the fourth active semiconductor region. A first width ratio of the width W1' to the width W1 provides a first operational difference between the first PD GAA transistor and the first PG GAA transistor, and a second width ratio of the width W2' to the width W2 provides a second operational difference between the first PD GAA transistor and the first PG GAA transistor.

In some embodiments, the first operational difference is an on-current of the first PD GAA transistor that is greater than an on-current of the first PG GAA transistor and the second operational difference is an on-current of the second PD GAA transistor that is greater than an on-state current of the second PG GAA transistor. In some embodiments, a first beta ratio of the on-current of the first PD GAA transistor and the on-current of the first PG GAA transistor is about 1.1 to about 1.4 and a second beta ratio of the on-current of the second PD GAA transistor and the on-current of the second PG GAA transistor is about 1.1 to about 1.4. In some embodiments, the first operational difference is a threshold voltage of the first PD GAA transistor that is less than a threshold voltage of the first PG GAA transistor and the second operational difference is a threshold voltage of the second PD GAA transistor that is less than a threshold voltage of the second PG GAA transistor. In some embodiments, a first SRAM cell includes the first PG GAA transistor, the first PD GAA transistor, the second PG GAA transistor, and the second PD GAA transistor. In such embodiments, the memory cell structure further includes a second SRAM cell that is adjacent to and a mirror image of the first SRAM cell along an axis along the second direction, where the first active semiconductor region and the fourth active semiconductor region extend continuously from the first SRAM cell to the second SRAM cell.

In some embodiments, in a top portion of a memory cell, the first PD GAA transistor, the first PU GAA transistor, and the second PG GAA transistor are sequentially and substantially aligned along the second direction, such that a first spacing is between the first PD portion of the first active semiconductor region and the second active semiconductor region and a second spacing is between the third active semiconductor region and the second PG portion of the fourth active semiconductor region. The first spacing and the second spacing are along the second direction. In such embodiments, in a bottom portion of the memory cell, the first PG GAA transistor, the second PU GAA transistor, and the second PD GAA transistor are sequentially and substantially aligned along the second direction, such that the second spacing is between the first PG portion of the first active semiconductor region and the second active semiconductor region and the first spacing is between the third active semiconductor region and the second PD portion of the fourth active semiconductor region. The first spacing is less than the second spacing.

An exemplary method includes receiving an active region layout for a memory and identifying a shared active region in the active region layout. The shared active region is shared by a pass-gate GAA transistor and a pull-down GAA transistor of the memory. The shared active region has a first width along an entirety of a length of the shared active region. The method further includes enlarging a pull-down portion of the shared active region that corresponds with the pull-down GAA transistor to a second width relative to the first width of a pass-gate portion of the shared active region that corresponds with the pass-gate GAA transistor. The enlarging includes tuning a ratio of the second width to the first width to provide an operational difference between the pull-down GAA transistor and the pass-gate GAA transistor. In some embodiments, the method further includes fabricating the memory using a modified active region layout generated from the enlarging of the pull-down portion of the shared active region that corresponds with the pull-down GAA transistor, such that a channel width of the pull-down GAA transistor is greater than a channel width of the pass-gate GAA transistor in the fabricated memory. In some embodiments, the enlarging tunes the ratio of the second width to the first width to provide the memory with a beta ratio that is about 1.1 to about 1.4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell structure comprising:
a first pull-down (PD) gate-all-around (GAA) transistor, a second PD GAA transistor, a first pass-gate (PG) GAA transistor, and a second PG GAA transistor having a shared active semiconductor region, wherein:
the shared active semiconductor region extends along a first direction, the first PD GAA transistor and the first PG GAA transistor belong to a first memory cell, and the second PD GAA transistor and the second PG GAA transistor belong to a second memory cell adjacent to the first memory cell;
the shared active semiconductor region has a PG active portion that corresponds with the first PG GAA transistor and the second PG GAA transistor and a PD active portion adjacent to the PG active portion that corresponds with the first PD GAA transistor and the second PD GAA transistor;
the first PD GAA transistor and the first PG GAA transistor each have a first channel length and the second PD GAA transistor and the second PG GAA transistor each have a second channel length, wherein the first channel length and the second channel length are along the first direction;
the PG active portion has a width W1 along a second direction and the PD active portion has a width W1' along the second direction, wherein the second direction is perpendicular to the first direction;
the width W1' is enlarged with respect to the width W1 by an enlargement width to provide the first PD GAA transistor and the second PD GAA transistor with a first channel width along the second direction and a first threshold voltage and the first PG GAA transistor and the second PG GAA transistor with a second channel width along the second direction and a second threshold voltage;
the first channel width is greater than the second channel width and the first threshold voltage is less than the second threshold voltage;
the PD active portion of the shared active semiconductor region has a first extension portion having a width W2 and a second extension portion having a width W3; and
the PD active portion of the shared active semiconductor region extends beyond a first sidewall of the PG active portion of the shared active semiconductor region along the second direction by the width W2 and beyond a second sidewall of the PG active portion of the shared active semiconductor region along the second direction by the width W3, wherein the width W1 is between the first sidewall of the PG active portion and the second sidewall of the PG active portion and the width W1' is a sum of the width W1, the width W2, and the width W3.

2. The memory cell structure of claim 1, wherein a ratio of width W1' to width W1 provides each of the first memory cell and the second memory cell with a beta ratio that is about 1.1 to about 1.4.

3. The memory cell structure of claim 1, wherein a difference between the first threshold voltage and the second threshold voltage is about 30 mV to about 70 mV.

4. The memory cell structure of claim 1, wherein a first on-current of the first PD GAA transistor is greater than a second on-current of the first PG GAA transistor and a third on-current of the second PD GAA transistor is greater than a fourth on-state current of the second PG GAA transistor.

5. The memory cell structure of claim 1, wherein the enlargement width is about 1 nm to about 4 nm.

6. The memory cell structure of claim 1, wherein the shared active semiconductor region is a first active semiconductor region, the memory cell structure further comprising:
a pull-up GAA transistor having a second active semiconductor region that extends along the first direction and is directly adjacent to the first active semiconductor region, wherein a first spacing along the second direction between the PG active portion of the first active semiconductor region and the second active semiconductor region is greater than a second spacing along the second direction between the PD active portion of the first active semiconductor region and the second active semiconductor region.

7. The memory cell structure of claim 6, wherein the second active semiconductor region has a width W2 along the second direction that is less than width W1.

8. The memory cell structure of claim 1, wherein the first channel width is the same as the width W1' and the second channel width is the same as the width W1.

9. The memory cell structure of claim 1, wherein the first channel width is less than the width W1' and the second channel width is less than the width W1.

10. The memory cell structure of claim 1, wherein:
the PD active portion of the shared active semiconductor region includes a first PD active portion and a second PD active portion, wherein the PG active portion is disposed between the first PD active portion and the second PD active portion;
the first PD active portion corresponds with the first PD GAA transistor and the second PD active portion corresponds with the second PD GAA transistor; and
the first PD active portion and the second PD active portion have the width W1'.

11. The memory cell structure of claim 1, wherein:
the PG active portion of the shared active semiconductor region includes a first PG active portion and a second PG active portion, wherein the PD active portion is disposed between the first PG active portion and the second PG active portion;
the first PG active portion corresponds with the first PG GAA transistor and the second PG active portion corresponds with the second PG GAA transistor; and
the first PG active portion and the second PG active portion have the width W1.

12. The memory cell structure of claim 1, wherein a first work function of a first metal gate of the first PD GAA transistor is the same as a second work function of a second metal gate of the first PG GAA transistor.

13. A memory cell structure comprising:
a first active semiconductor region, a second active semiconductor region, a third active semiconductor region, and a fourth active semiconductor region that extend substantially parallel along a first direction, wherein:
a first pull-up (PU) GAA transistor includes the second active semiconductor region and a second PU GAA transistor includes the third active semiconductor region;
a first pass-gate (PG) GAA transistor and a first pull-down (PD) GAA transistor share the first active semiconductor region, wherein the first active semiconductor region has a first PD portion disposed over a first PG portion along the first direction, wherein the first PD portion corresponds with the first PD GAA transistor and the first PG portion corresponds with the first PG GAA transistor;
a second PG GAA transistor and a second PD GAA transistor share the fourth active semiconductor region, wherein the fourth active semiconductor region has a second PG portion disposed over a second PD portion along the first direction, wherein the second PG portion corresponds with the second PG GAA transistor and the second PD portion corresponds with the second PD GAA transistor;
the first PG portion of the first active semiconductor region has a width W1 between a first sidewall and a second sidewall, the second PG portion of the fourth active semiconductor region has a width W2 between a third sidewall and a fourth sidewall, wherein the width W1 and the width W2 are along a second direction that is perpendicular to the first direction;
the first PD portion of the first active semiconductor region has a width W1' along the second direction that is enlarged with respect to the width W1, wherein the first PD portion extends beyond the first sidewall and the second sidewall of the first PG portion of the first active semiconductor region;
the second PD portion of the fourth active semiconductor region has a width W2' along the second direction that is enlarged with respect to the width W2, wherein the second PD portion extends beyond the third sidewall and the fourth sidewall of the second PG portion of the fourth active semiconductor region; and
a first width ratio of the width W1' to the width W1 provides a first operational difference between the first PD GAA transistor and the first PG GAA transistor and a second width ratio of the width W2' to the width W2 provides a second operational difference between the second PD GAA transistor and the second PG GAA transistor.

14. The memory cell structure of claim 13, wherein the first operational difference is an on-current of the first PD GAA transistor that is greater than an on-current of the first PG GAA transistor and the second operational difference is an on-current of the second PD GAA transistor that is greater than an on-state current of the second PG GAA transistor.

15. The memory cell structure of claim 14, wherein:
a first beta ratio of the on-current of the first PD GAA transistor and the on-current of the first PG GAA transistor is about 1.1 to about 1.4; and
a second beta ratio of the on-current of the second PD GAA transistor and the on-current of the second PG GAA transistor is about 1.1 to about 1.4.

16. The memory cell structure of claim 13, wherein the first operational difference is a threshold voltage of the first PD GAA transistor that is less than a threshold voltage of the first PG GAA transistor and the second operational difference is a threshold voltage of the second PD GAA transistor that is less than a threshold voltage of the second PG GAA transistor.

17. The memory cell structure of claim 13, wherein:
in a top portion of a memory cell, the first PD GAA transistor, the first PU GAA transistor, and the second PG GAA transistor are sequentially and substantially aligned along the second direction, such that a first spacing is between the first PD portion of the first active semiconductor region and the second active semiconductor region and a second spacing is between the third active semiconductor region and the second PG portion of the fourth active semiconductor region, wherein the first spacing and the second spacing are along the second direction; and in a bottom portion of the memory cell, the first PG GAA transistor, the second PU GAA transistor, and the second PD GAA transistor are sequentially and substantially aligned along the second direction, such that the second spacing is between the first PG portion of the first active semiconductor region and the second active semiconductor region and the first spacing is between the third active semiconductor region and the second PD portion of the fourth active semiconductor region, wherein the first spacing is less than the second spacing.

18. The memory cell structure of claim 13, wherein:
a first SRAM cell includes the first PG GAA transistor, the first PD GAA transistor, the second PG GAA transistor, and the second PD GAA transistor; and
the memory cell structure further includes a second SRAM cell that is adjacent to and a mirror image of the first SRAM cell along an axis along the second direction, wherein the first active semiconductor region and the fourth active semiconductor region extend continuously from the first SRAM cell to the second SRAM cell.

19. A method comprising:
receiving an active region layout for a memory;
identifying a shared active region in the active region layout, wherein the shared active region is shared by a pass-gate GAA transistor and a pull-down GAA transistor of the memory and the shared active region has a first width along an entirety of a length of the shared active region;
enlarging a pull-down portion of the shared active region that corresponds with the pull-down GAA transistor to a second width relative to the first width of a pass-gate portion of the shared active region that corresponds with the pass-gate GAA transistor, wherein the enlarging includes:
adding a first extension portion having a third width to the pull-down portion of the shared active region and a second extension portion having a fourth width to the pull-down portion of the shared active region, such that the pull-down portion of the shared active region extends beyond a first sidewall of the pass-gate portion of the shared active region by the third width and beyond a second sidewall of the pass-gate portion of the shared active region by the fourth width, wherein the first width is between the first sidewall of the pass-gate portion of the shared active region and the second sidewall of the pass-gate portion of the shared active region after the enlarging and the second width is a sum of the first width, the third width, and the fourth width; and
tuning a ratio of the second width to the first width to provide an operational difference between the pull-down GAA transistor and the pass-gate GAA transistor; and
fabricating the memory using a modified active region layout generated from the enlarging of the pull-down portion of the shared active region that corresponds with the pull-down GAA transistor, wherein a channel width of the pull-down GAA transistor is greater than a channel width of the pass-gate GAA transistor in the fabricated memory.

20. The method of claim 19, wherein the enlarging tunes the ratio of the second width to the first width to provide the memory with a beta ratio that is about 1.1 to about 1.4.

* * * * *